(12) United States Patent
Treibergs et al.

(10) Patent No.: US 11,906,576 B1
(45) Date of Patent: Feb. 20, 2024

(54) CONTACT ASSEMBLY ARRAY AND TESTING SYSTEM HAVING CONTACT ASSEMBLY ARRAY

(71) Applicant: Johnstech International Corporation, Minneapolis, MN (US)

(72) Inventors: Valts Treibergs, White Bear Township, MN (US); Max A. Carideo, Plymouth, MN (US); David Skodje, Minneapolis, MN (US); Melissa Hasskamp, Minneapolis, MN (US)

(73) Assignee: JOHNSTECH INTERNATIONAL CORPORATION, Minneapolis, MN (US)

( * ) Notice: Subject to any disclaimer, the term of this patent is extended or adjusted under 35 U.S.C. 154(b) by 37 days.

(21) Appl. No.: 17/730,391

(22) Filed: Apr. 27, 2022

Related U.S. Application Data

(60) Provisional application No. 63/183,742, filed on May 4, 2021.

(51) Int. Cl.
*G01R 31/28* (2006.01)
*G01R 1/067* (2006.01)
*G01R 3/00* (2006.01)

(52) U.S. Cl.
CPC ..... *G01R 31/2886* (2013.01); *G01R 1/06738* (2013.01); *G01R 3/00* (2013.01)

(58) Field of Classification Search
CPC .............. G01R 1/0466; G01R 1/06738; G01R 1/0416; G01R 31/2886; G01R 31/2889
See application file for complete search history.

(56) References Cited

U.S. PATENT DOCUMENTS

| | | | |
|---|---|---|---|
| 7,074,049 B2 | 7/2006 | O'Sullivan et al. | |
| 7,255,576 B2 | 8/2007 | O'Sullivan et al. | |
| 7,256,593 B2 | 8/2007 | Treibergs | |
| 7,338,293 B2 | 3/2008 | Gilk | |
| 7,639,026 B2 | 12/2009 | Shell et al. | |
| 7,722,361 B2 | 5/2010 | Lopez et al. | |
| 7,862,391 B2 | 1/2011 | Johnston et al. | |
| 7,918,669 B1 | 4/2011 | Tiengtum | |
| 8,354,854 B2 | 1/2013 | Sherry | |
| 8,441,275 B1 * | 5/2013 | Alladio | G01R 1/0466 439/91 |
| 8,460,010 B2 | 6/2013 | Kimura et al. | |
| 8,523,579 B2 | 9/2013 | Johnston et al. | |
| 8,558,554 B2 | 10/2013 | Erdman | |
| 8,988,090 B2 | 3/2015 | Erdman et al. | |
| 9,328,201 B2 | 5/2016 | Ebert et al. | |
| 9,500,673 B2 | 11/2016 | Erdman et al. | |
| 9,606,143 B1 | 3/2017 | Sherry et al. | |
| 9,829,506 B2 | 11/2017 | Treibergs et al. | |

(Continued)

*Primary Examiner* — Paresh Patel
(74) *Attorney, Agent, or Firm* — Hamre, Schumann, Mueller & Larson, P.C.

(57) ABSTRACT

A contact assembly for a testing system for testing integrated circuit devices is disclosed. The contact assembly includes a first blade, a second blade, and an elastomer configured to retain the first blade and the second blade. The first blade and the second blade are electrically conductive. The first blade and the second blade are arranged in a cross configuration so that the first blade and the second blade form a substantially X-shape when assembled. The elastomer is at least columnar in part and non-conductive.

20 Claims, 26 Drawing Sheets

(56) References Cited

U.S. PATENT DOCUMENTS

| | | | |
|---|---|---|---|
| 10,247,755 B2 | 4/2019 | Erdman et al. | |
| 10,725,069 B1 | 7/2020 | Nelson et al. | |
| 2006/0279301 A1* | 12/2006 | Treibergs | G01R 1/0466 |
| | | | 324/754.05 |
| 2010/0264935 A1 | 10/2010 | Erdman et al. | |
| 2011/0024911 A1 | 2/2011 | Shibuya et al. | |
| 2014/0103952 A1* | 4/2014 | Kuong | G01R 1/0466 |
| | | | 324/755.01 |
| 2014/0273307 A1 | 9/2014 | Butsoongnoen et al. | |
| 2015/0241474 A1 | 8/2015 | Landa et al. | |
| 2016/0204537 A1 | 7/2016 | Nazzaro et al. | |
| 2019/0072583 A1 | 3/2019 | Tan et al. | |
| 2022/0107359 A1 | 4/2022 | Treibergs et al. | |

* cited by examiner

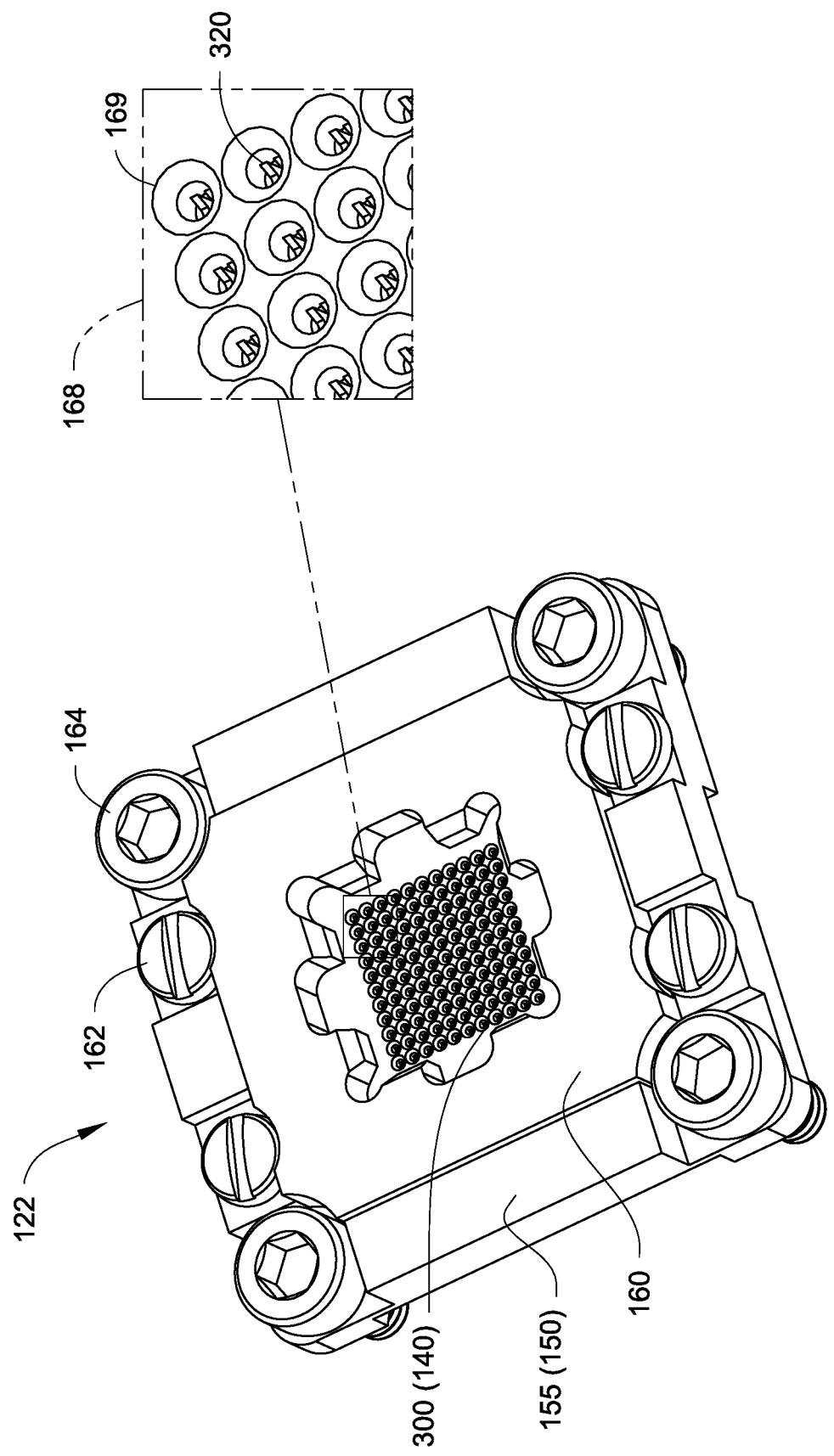

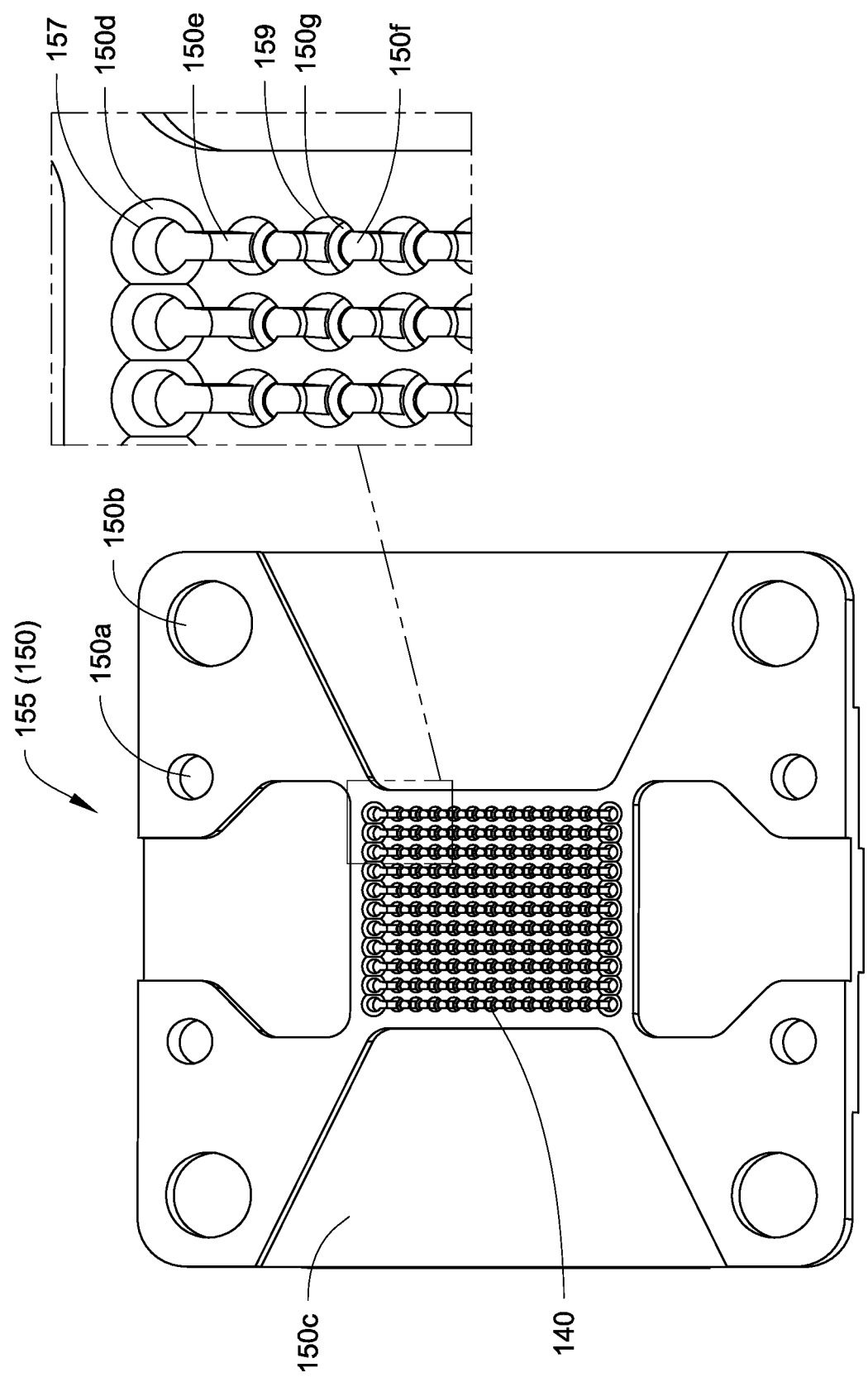

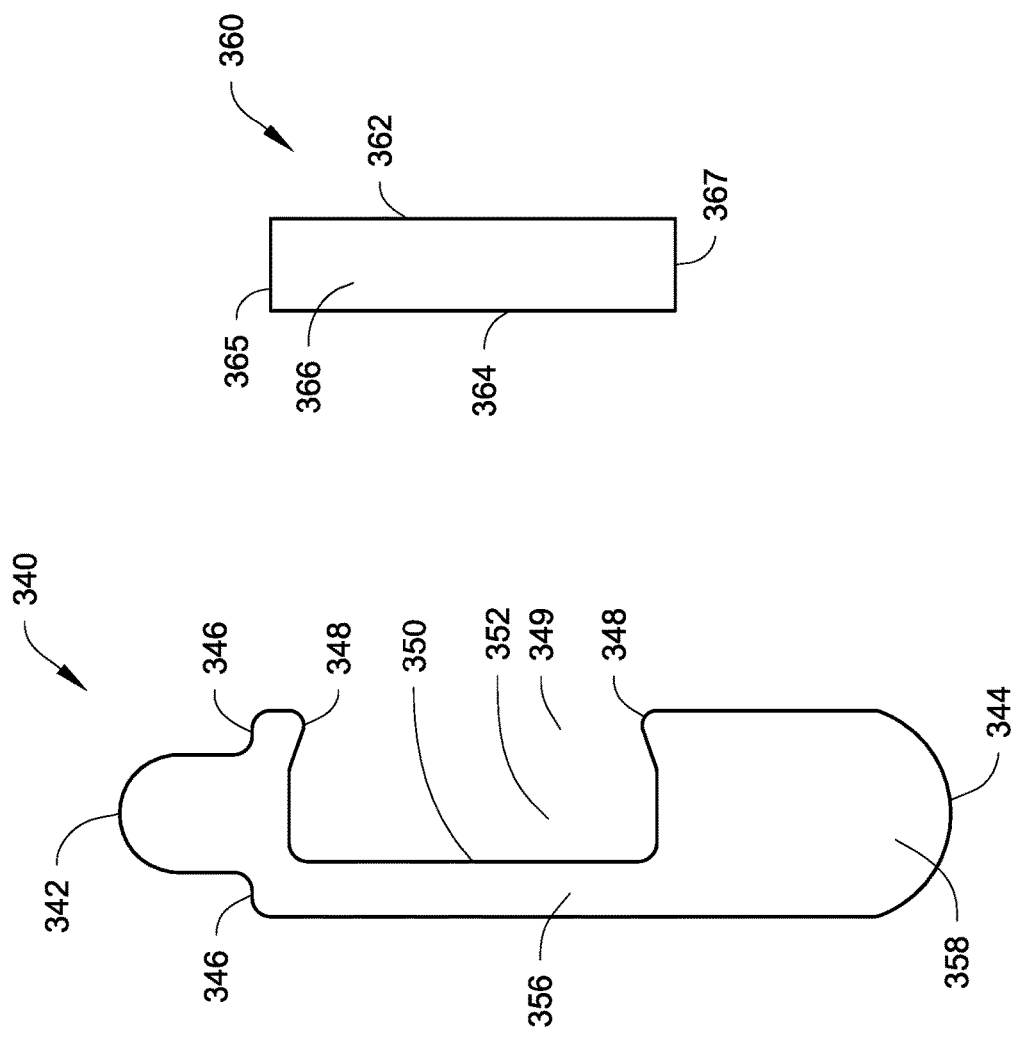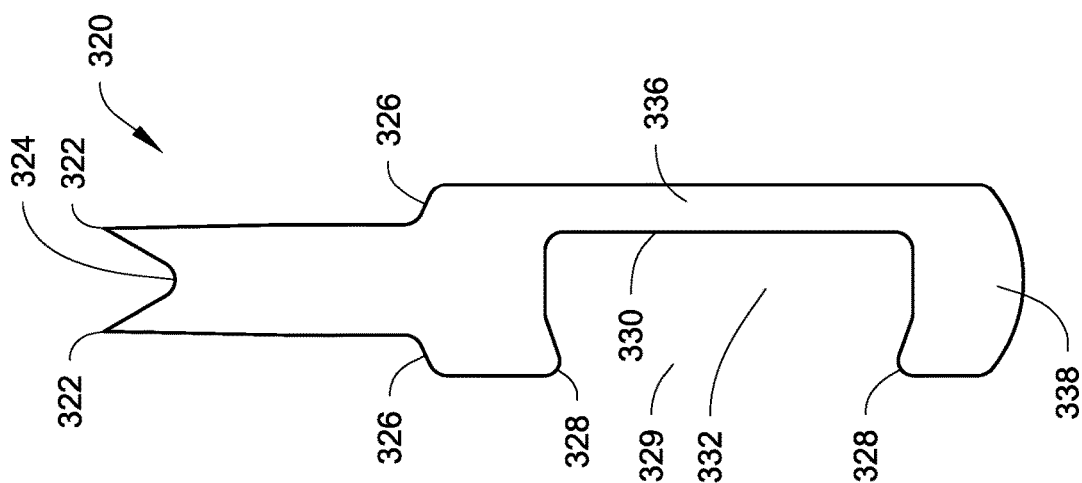

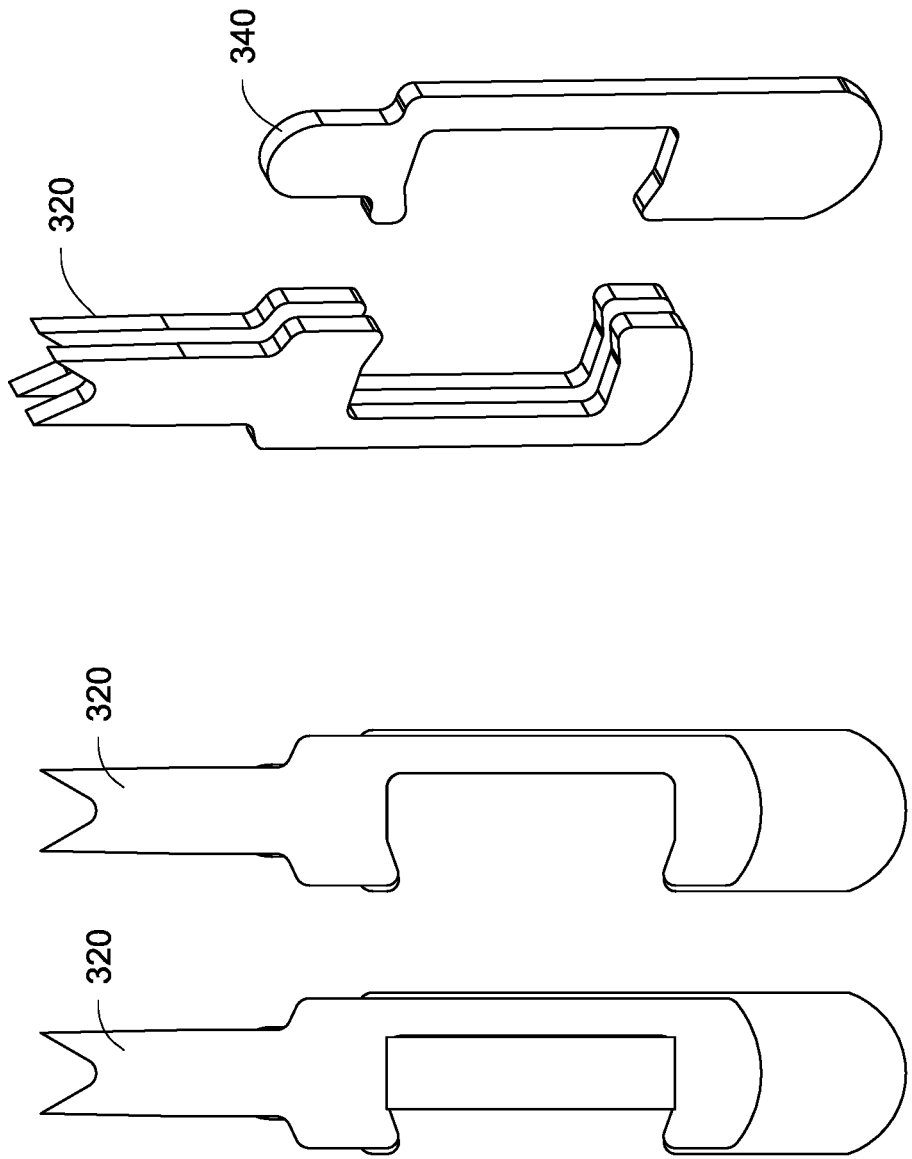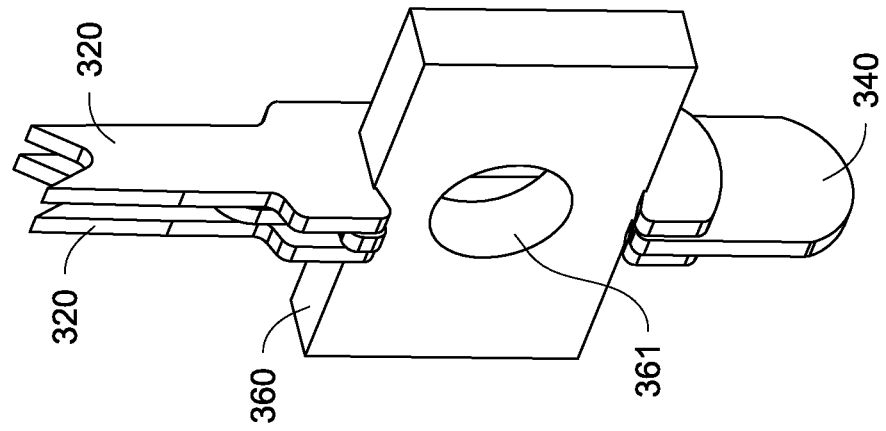

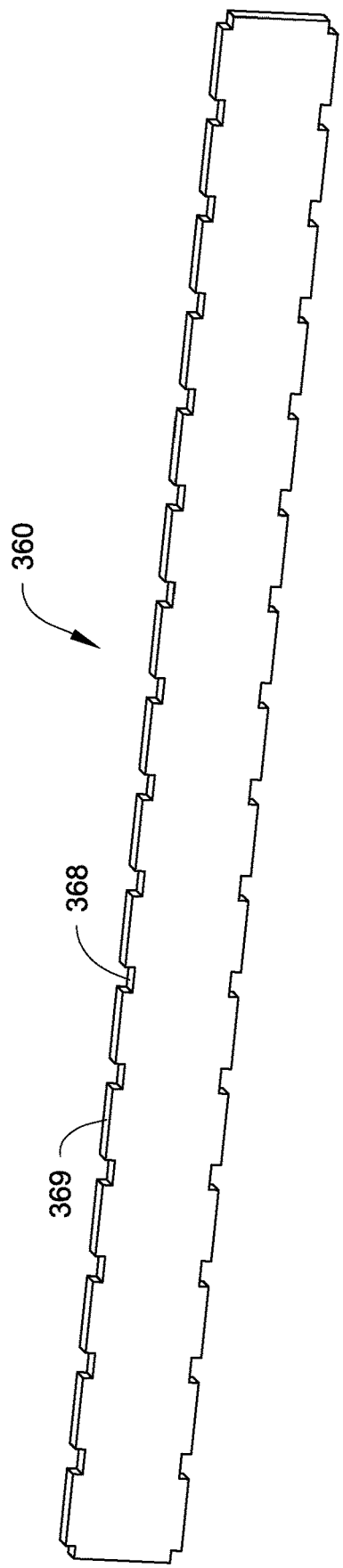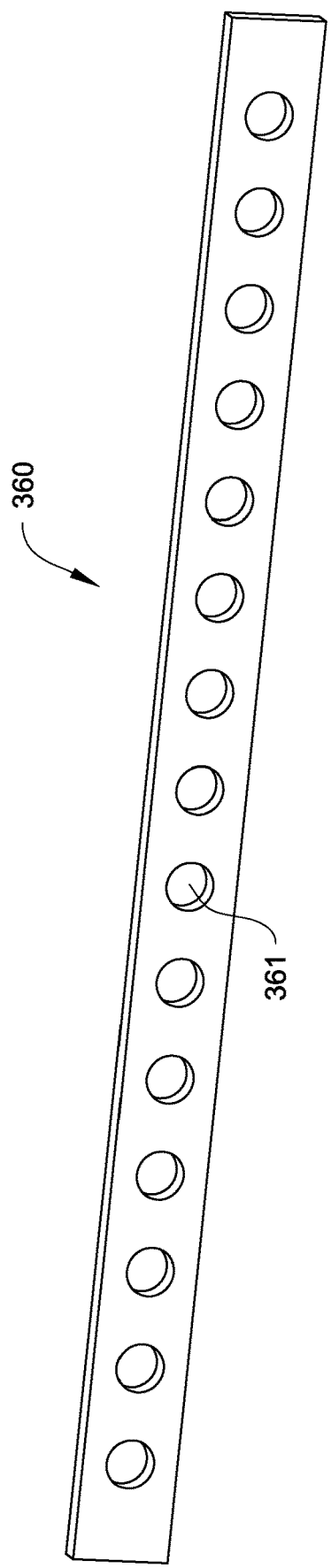
Fig. 9A
Fig. 9B

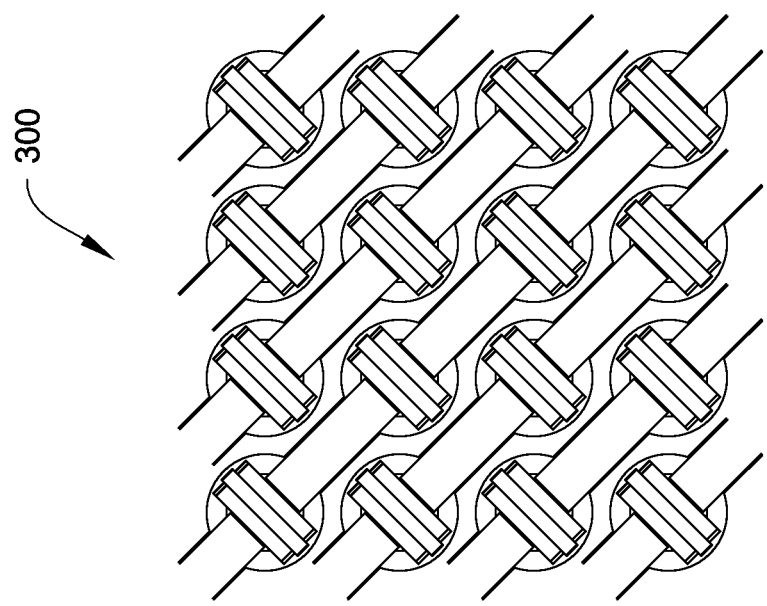
Fig. 12
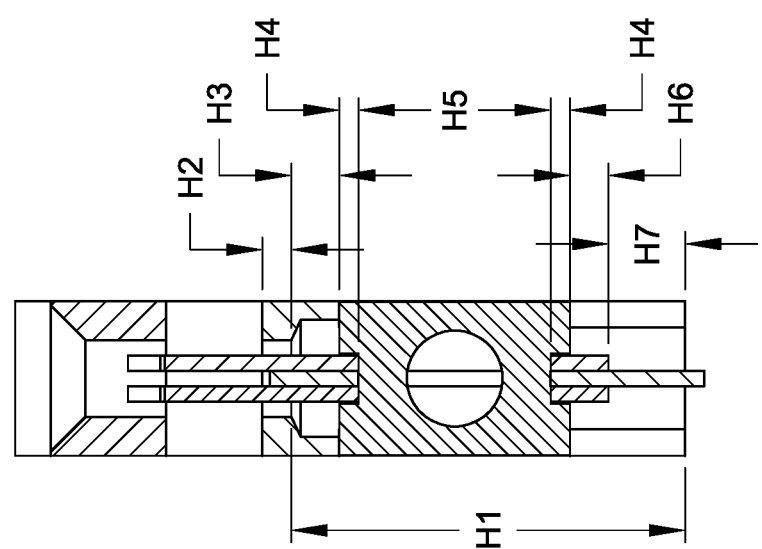
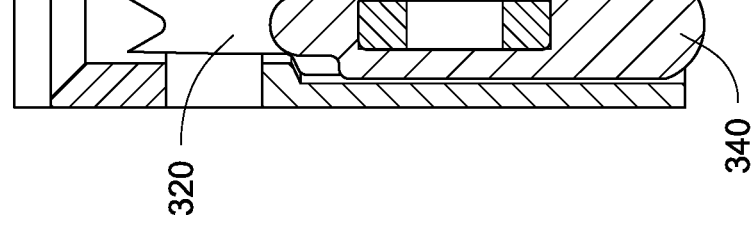
Fig. 11

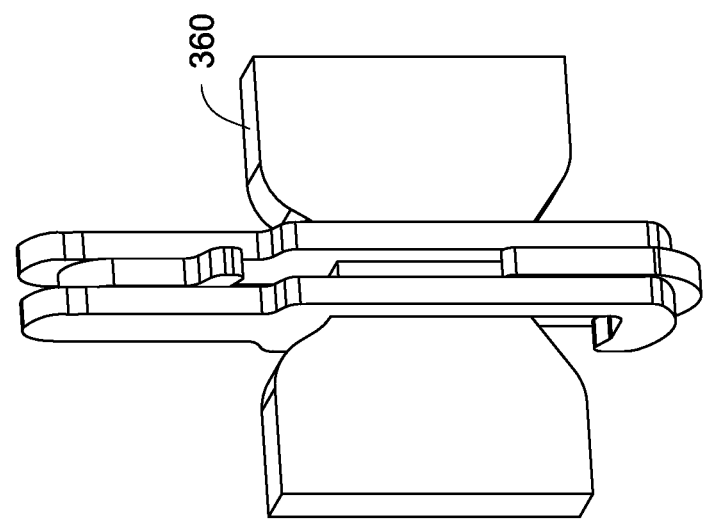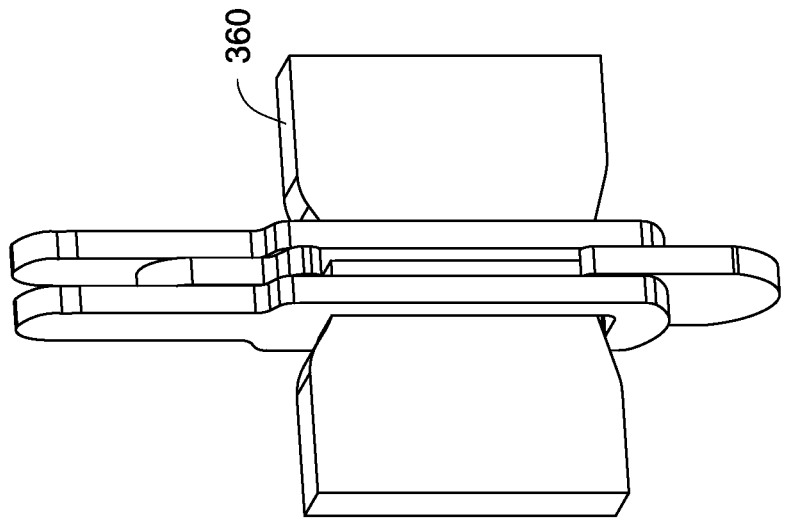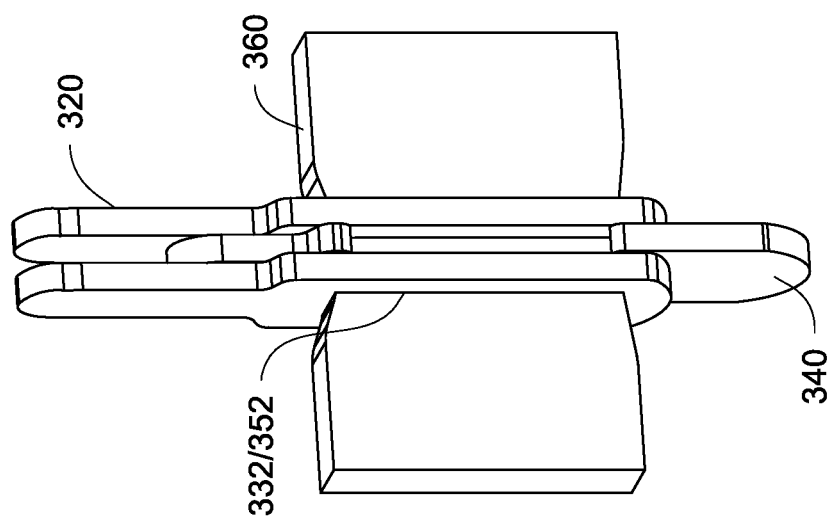

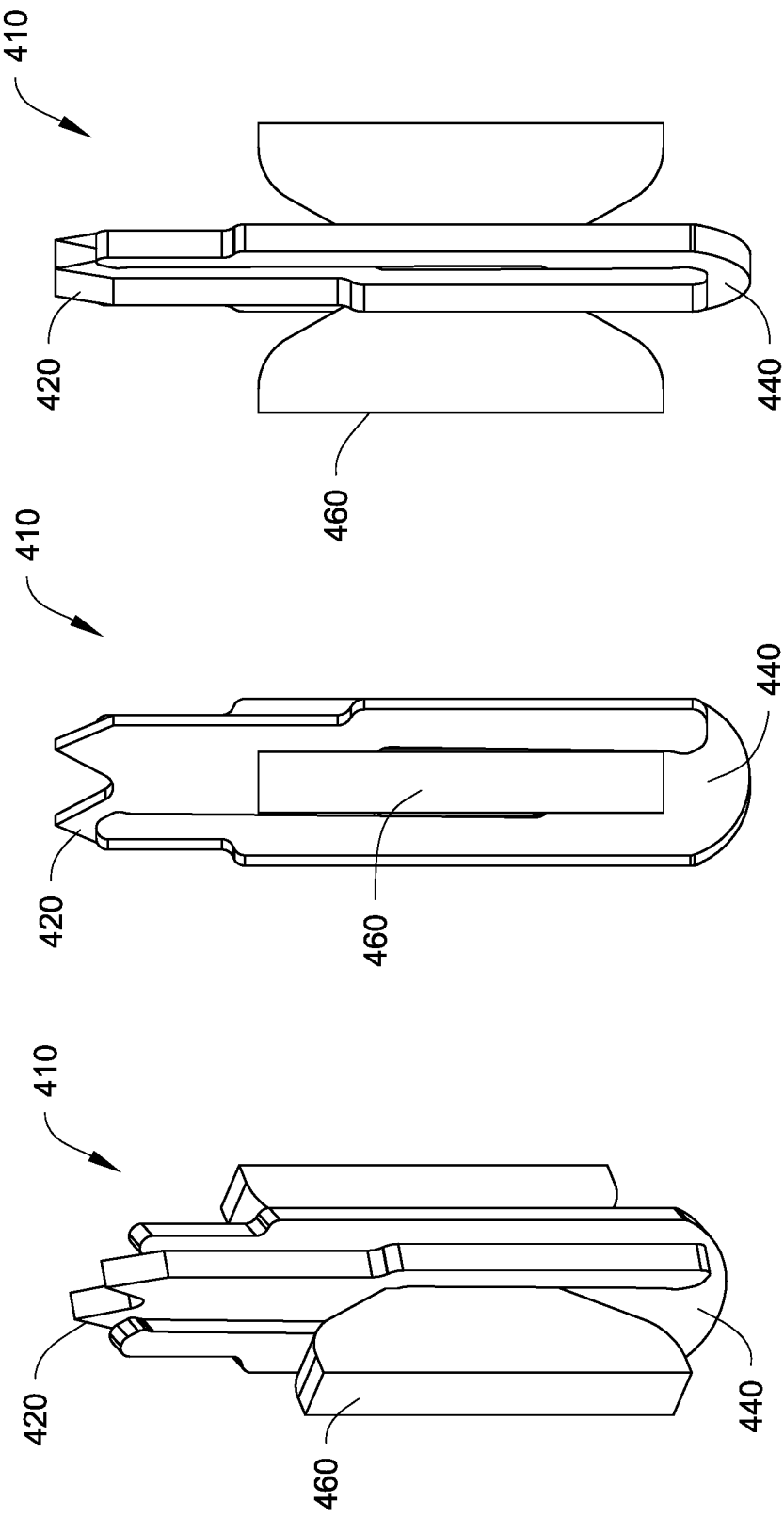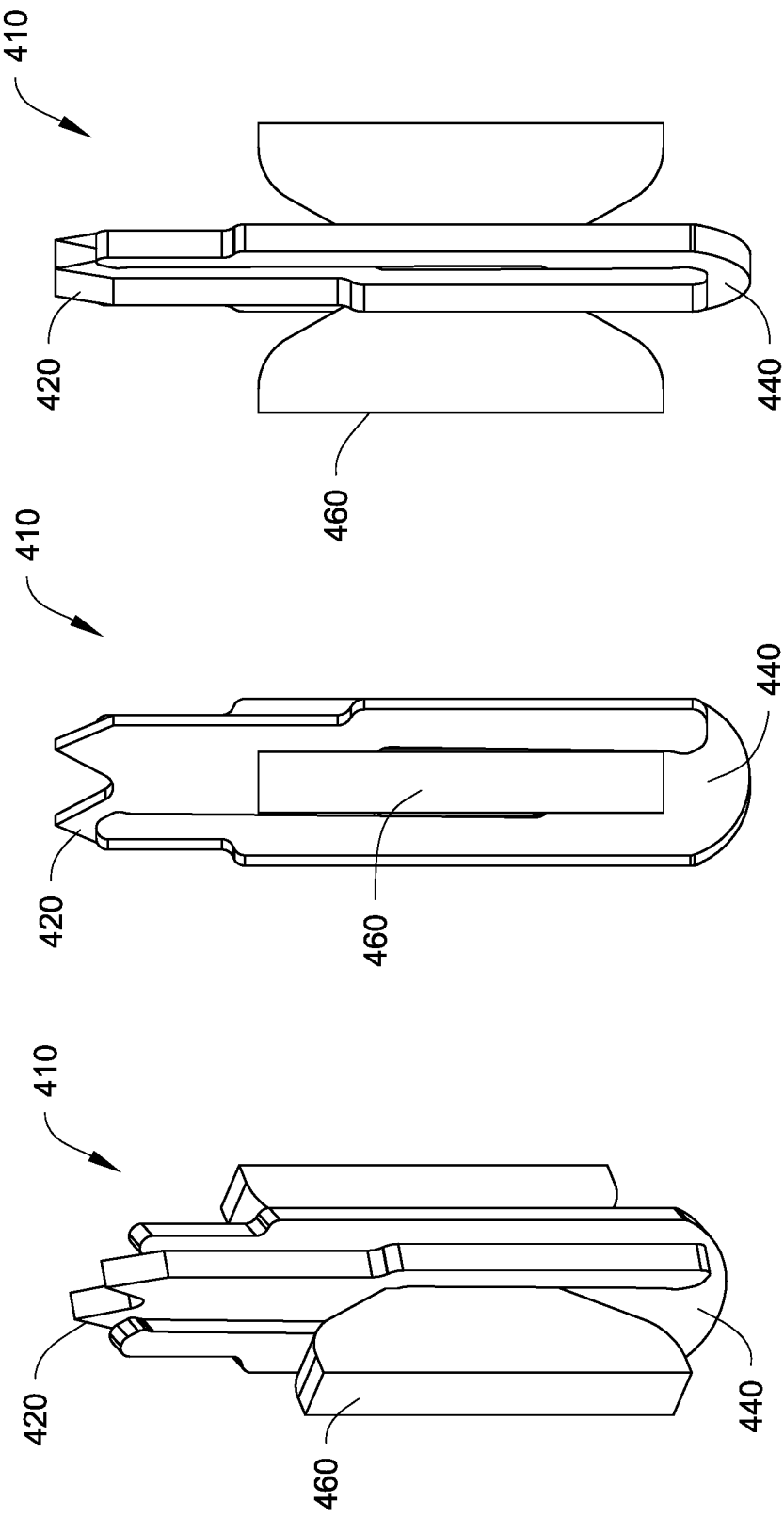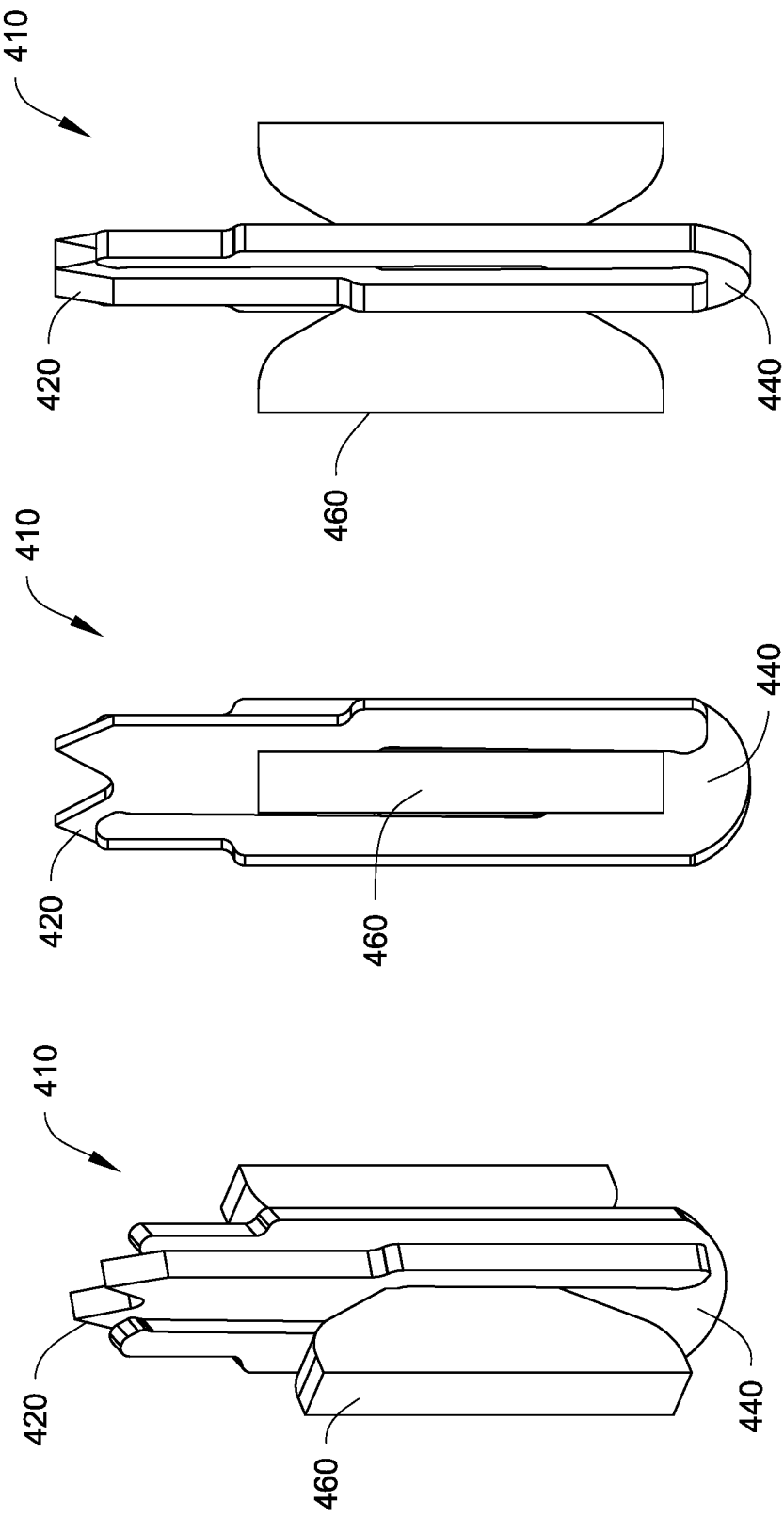

CONTACT ASSEMBLY ARRAY AND TESTING SYSTEM HAVING CONTACT ASSEMBLY ARRAY

TECHNICAL FIELD

This disclosure relates generally to the field of testing microcircuits (e.g., chips such as semiconductor devices, integrated circuits, etc.). More specifically, the disclosure relates to a contact assembly array that provide electrical connection to a device under test (DUT) by making contact to a load board of a testing system, and relates to testing systems having the contact assembly array.

BACKGROUND

The manufacturing processes for microcircuits cannot guarantee that every microcircuit is fully functional. Dimensions of individual microcircuits are microscopic and process steps very complex, so small or subtle failures in a manufacturing process can often result in defective devices. Mounting a defective microcircuit on a circuit board is relatively costly. Installation usually involves soldering the microcircuit onto the circuit board. Once mounted on a circuit board, removing a microcircuit is problematic because the very act of melting the solder for a second time may ruin the circuit board. Thus, if the microcircuit is defective, the circuit board itself is probably ruined as well, meaning that the entire value added to the circuit board at that point is lost. For all these reasons, a microcircuit is usually tested before installation on a circuit board. Each microcircuit must be tested in a way that identifies all defective devices, but yet does not improperly identify good devices as defective. Either kind of error, if frequent, adds substantial overall cost to the circuit board manufacturing process.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacing between them, even small errors in making the contact will result in incorrect connections. A further problem in microcircuit test equipment arises in automated testing. Testing equipment may test one hundred devices a minute, or even more. The sheer number of tests cause wear on the tester contacts making electrical connections to the microcircuit terminals during testing. This wear dislodges conductive debris from both the tester contacts and the device under test (DUT) terminals that contaminates the testing equipment and the DUTs themselves. The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester contacts that perform well are advantageous. Minimizing the time required to replace them is also desirable, since test equipment is expensive. If the test equipment is off line for extended periods of normal maintenance, the cost of testing an individual microcircuit increases. Test equipment in current use has an array of test contacts that mimic the pattern of the microcircuit terminal array. The array of test contacts is supported in a structure that precisely maintains the alignment of the contacts relative to each other. An alignment board or plate or template aligns the microcircuit itself with the test contacts. The test contacts and the alignment board are mounted on a load board having conductive pads that make electrical connection to the test contacts. The load board pads are connected to circuit paths that carry the signals and power between the test equipment electronics and the test contacts.

One particular type of microcircuit often tested before installation has a package type of ball grid array (BGA). BGA is a type of surface-mount packaging used for integrated circuits. A BGA package can provide more signal and power (S&P) terminals than can be put on other packages since the whole bottom surface of the BGA device can be used, instead of just the perimeter. The BGA package is typically used for high speed applications. It will be appreciated that the package type of the microcircuit under test is not limited to BGA package. Solid electrical contact and sufficient compliance are needed for testing microcircuit in high speed applications.

BRIEF SUMMARY

Embodiments disclosed herein provide a solution that addresses each of the above-mentioned problems. Embodiments disclosed herein provide a contact assembly array that is composed of simple elements, uses an elastomeric component (e.g., made of a non-conductive material), is configurable to a wide-variety of shapes and sizes, can be cleaned by existing methods without changes, is robust in a production environment, and is low-cost. In one embodiment, the contact assembly array can be composed of multiple contact pieces in blade (or plate) form with elastomer in shear and compression between the contact pieces, such that the elastomer pushes the contact pieces vertically in opposing direction to set the force of the contact pieces perpendicular to the DUT and the load board. The contact pieces are retained by the elastomer and guided by the housing of the test contactor.

Also disclosed is a contact assembly for a testing system for testing integrated circuit devices. The contact assembly includes a pair of first blades and a second blade in a side by side generally parallel relationship, and an elastomer configured to retain the first blades and the second blade. The first blades and the second blade are configured to be longitudinally slidable with respect to each other. The second blade is disposed between the pair of first blades. The first blades and the second blade are staggered in a longitudinal direction. The first blades and the second blade are electrically conductive. Each blade of the first blades and the second blade includes a first end and a second end opposite to the first end in the longitudinal direction. The first blades and the second blade are arranged so that the first end of each blade is opposite to the first end of an adjacent blade in the longitudinal direction, so that the first end of one blade is adjacent the second end of the adjacent blade. The elastomer is at least columnar in part and non-conductive.

Also disclosed is a testing system for testing integrated circuit devices. The testing system includes a device under test, a load board, and a contact assembly. The contact assembly includes a pair of first blades and a second blade in a side by side generally parallel relationship, and an elastomer configured to retain the first blades and the second blade. The first blades and the second blade are configured to be longitudinally slidable with respect to each other. The second blade is disposed between the pair of first blades. The first blades and the second blade are staggered in a longitudinal direction. The first blades and the second blade are electrically conductive. Each blade of the first blades and the second blade includes a first end and a second end opposite to the first end in the longitudinal direction. The first blades and the second blade are arranged so that the first end of each blade is opposite to the first end of an adjacent blade in the longitudinal direction, so that the first end of one blade is adjacent the second end of the adjacent blade. The elastomer is at least columnar in part and non-conductive. The first end of each of the first blades is configured to contact terminals of the device under test. The first end of the second blade is configured to contact terminals of the load board.

Also disclosed is a method of assembling and positioning a contact assembly in a testing system for testing integrated circuit devices. The method includes arranging a pair of first blades and a second blade of the contact assembly so that a first end of each blade of the first blades and the second blade is opposite to a first end of an adjacent blade in a longitudinal direction. The first end of one blade is adjacent a second end of an adjacent blade. The second end is opposite to the first end in the longitudinal direction. The second blade is disposed between the pair of first blades. The first blades and the second blade are staggered in the longitudinal direction. The first blades and the second blade are electrically conductive. The method also includes retaining the first blades and the second blade with an elastomer of the contact assembly. The first blades and the second blade are in a side by side generally parallel relationship. The first blades and the second blade are configured to be longitudinally slidable with respect to each other. The elastomer is at least columnar in part and non-conductive. The method further includes installing the contact assembly in a housing.

BRIEF DESCRIPTION OF THE SEVERAL VIEWS OF THE DRAWINGS

References are made to the accompanying drawings that form a part of this disclosure and which illustrate embodiments in which the systems and methods described in this specification can be practiced.

FIG. 5A is a top angle view of the assembled building blocks of a test contactor of a test assembly for the testing of a DUT, according to an embodiment.

FIG. 5C is a bottom view of a housing of a socket without the contact assembly array, according to an embodiment.

FIG. 6A is a side view of a DUT contact blade of a contact assembly, according to an embodiment.

FIG. 6B is a side view of a load board contact blade of a contact assembly, according to an embodiment.

FIG. 6C is a side view of an elastomer of a contact assembly, according to an embodiment.

FIG. 8A illustrates views of a contact assembly being assembled, according to an embodiment.

FIG. 8B is an exploded view of a contact assembly without the elastomer, according to an embodiment.

FIG. 9A is a perspective view of an elastomer, according to another embodiment.

FIG. 9B is a perspective view of an elastomer, according to yet another embodiment.

FIG. 11 is sectional views of a contact assembly being installed in a housing of a socket and an alignment plate, according to an embodiment.

FIG. 12 is a schematic view of a contact assembly array showing the elastomers on diagonal, according to an embodiment.

FIG. 13A is a perspective view of a contact assembly in an unactuated state, according to an embodiment.

FIG. 13B is a perspective view of a contact assembly in a preload actuated state, according to an embodiment.

FIG. 13C is a perspective view of a contact assembly in a fully actuated state, according to an embodiment.

FIGS. 17F-17I are perspective views of the contact assembly of FIG. 17A being assembled and in a compressed state, according to an embodiment.

Like reference numbers represent like parts throughout.

DETAILED DESCRIPTION

Figure 1A:
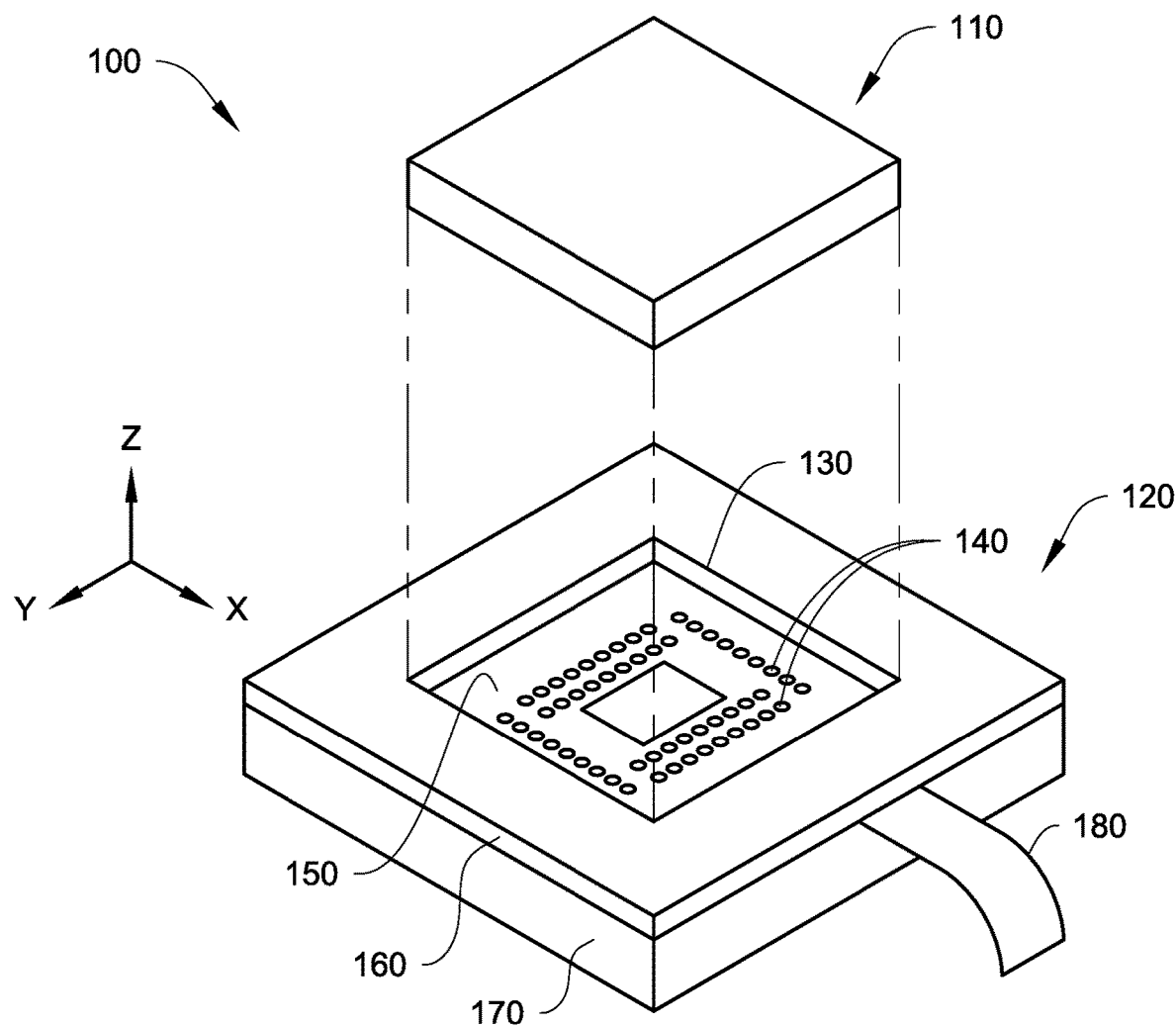
FIG. 1A is a perspective view of a part of a test system for receiving a DUT for testing, according to an embodiment.

A test contactor (i.e., a part of a test assembly including alignment plate, socket, etc.) can often provide electrical connection to a DUT including e.g., S&P terminals of the DUT by making metal-to-metal contact to the printed circuit board (e.g., the load board, including e.g., S&P terminals of the load board). A contact assembly array that has compliance has advantages in testing by accommodating DUT package variation. It will be appreciated that the term "compliance" may refer to a property of a material of undergoing elastic deformation or change in volume when subjected to an applied force. Compliance can be equal to the reciprocal of stiffness.

Embodiments disclosed herein can provide simple blades with low manufacturing cost, and elastomer compliance element with electrical path perpendicular to housing of the socket. Embodiments disclosed herein may not add electrical resonance modes like external convoluted metal spring solutions, allow for short blade(s) and minimize electrical signal length. Embodiments disclosed herein can provide multiple (e.g., a pair or more) DUT contact blades for redundant internal interfaces between the load board blade in event debris at one interface then electrical signal can travel through the other path(s); for handling offset error with center of the DUT terminals (e.g., solder ball or the like), and if the solder ball is off center, then one blade can still interface with the contact assembly; and for maximizing overlap area for sliding and wiping of DUT contact blade for area of electrical contact. Embodiments disclosed herein can also provide simple elastomer and planar geometries for low manufacturing cost. Contact assembly rotation can be limited by the elastomer, therefore cleaning operations are more efficient as the sweep direction to get in the tip groove of the blade is similar for all contact assemblies, without having to realign the contactor or blades. Embodiments disclosed herein can provide blades having space for elastomer growth due to differences in thermal coefficient of expansion and may not decrease the contact assembly internal interface normal force.

Embodiments disclosed herein provide a contact assembly array for test contactors and other devices that includes, for example, a stack of blades (or plates) or other adjacent conductive elements, which in some embodiments contain an aperture that accepts an elastomer that is used as a compliant member. The aperture, in some embodiments, in the blade stack is shaped such that the compressive forces on the elastomer allow it to bulge/expand into an open cavity instead of shearing the elastomer and so that the compressive forces do not increase with deflection and make the blades immovable.

Embodiments disclosed herein provide a contact assembly array that is composed of simple elements, uses an elastomeric component (e.g., made of a non-conductive material), is configurable to a wide-variety of shapes and sizes, can be cleaned by existing methods without changes, is robust in a production environment, and is low-cost. In one embodiment, the contact assembly array can be composed of a stack of blades (e.g., thin contact blades made of an electrical and/or thermal conductive material or plating). Each contact blade may have an elongated aperture near the center (e.g., below a centerline of the blade in the height direction), with the elongated aperture axis perpendicular to the axis of compliance of the contact assembly array. In one embodiment, the contact portion of the blade may have raised teeth or protrusions that make good contact with the DUT and/or the load board terminals.

FIG. 1A is a perspective view of a part of a test system 100 for receiving a DUT 110 for testing, according to an embodiment.

The test system 100 includes a test assembly 120 for a DUT (e.g., a microcircuit, etc.) 110. The test assembly 120 includes a load board 170 that supports an alignment plate 160 having an opening or aperture 130 that precisely defines the X and Y (see the coordinate indicators X and Y, where the coordinate X is perpendicular to the coordinate Y, and the coordinate Z is perpendicular to the plane of X and Y) positioning of the DUT 110 in test assembly 120. If the DUT 110 has orientation features, it is common practice to include cooperating features in aperture 130. Load board 170 carries on its surface, connection pads connected to a cable 180 by Signal and Power (S&P) conductors. Cable 180 connects to the electronics that perform that electrical testing of the DUT 110. Cable 180 may be very short or even internal to the test assembly 120 if the test electronics are integrated with the test assembly 120, or longer if the test electronics are on a separate chassis. It will be appreciated that the cable 180 can be optional. In another embodiment, the load board can be connected to test electronics by any other suitable means, including but not limited to e.g., spring loaded probes.

A test contact array 140 having a number of individual test contact elements precisely mirrors the S&P terminals (see 112 in FIG. 1B) carried on the surface of the DUT 110. When the DUT 110 is inserted in the aperture 130, S&P terminals of the DUT 110 precisely align with test contact array 140. The test assembly 120 is designed for compatibility with a test contact array 140 incorporating the device. Test contact array 140 is carried on a socket 150. Individual test contacts in array 140 are preferably formed on and in socket 150 using well-known photolithographic and laser machining processes. Socket 50 has alignment features such as holes or edge patterns located in the area between alignment plate 160 and load board 170 that provide for precise alignment of socket 150 with corresponding projecting features on alignment plate 160. All of the test contacts 140 are in precise alignment with the socket 150 alignment features. In this way, the test contacts of array 140 are placed in precise alignment with aperture 130.

Figure 1B:
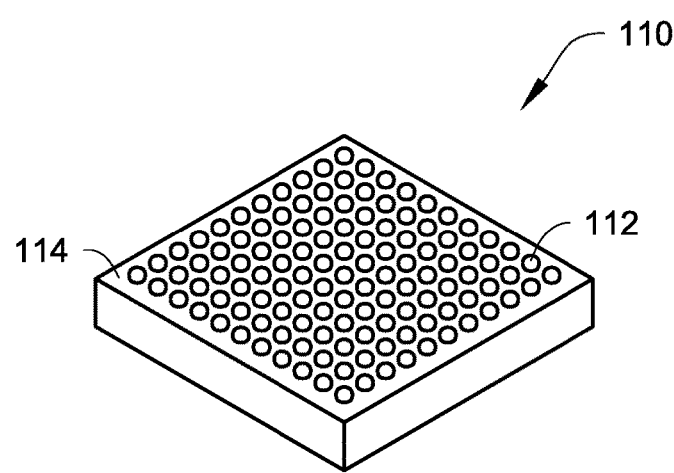
FIG. 1B is a perspective bottom view of a DUT, according to an embodiment.

FIG. 1B is a perspective bottom view of a DUT 110, according to an embodiment. The DUT (e.g., a microcircuit, etc.) 110 includes a top main surface (not shown), and a bottom main surface 114 opposite to the top main surface in the Z (see the coordinate indicators X, Y, and Z in FIG. 1A) direction. As shown in FIG. 1B, the DUT 110 has a ball grid array (BGA) package. BGA is a type of surface-mount packaging used for integrated circuits. A BGA package can provide more S&P terminals 112 than other packages since the whole bottom surface of the BGA device can be used, instead of just the perimeter. The BGA package is typically used for high speed applications. In another embodiment, the DUT 110 can have flat no-leads packages such as quad-flat no-leads (QFN) and dual-flat no-leads (DFN), wafer-level chip scale package (WL-CSP), leaded package such as thin small outline package (TSOP) or diode outline (DO) package, or the like.

Figure 2A:
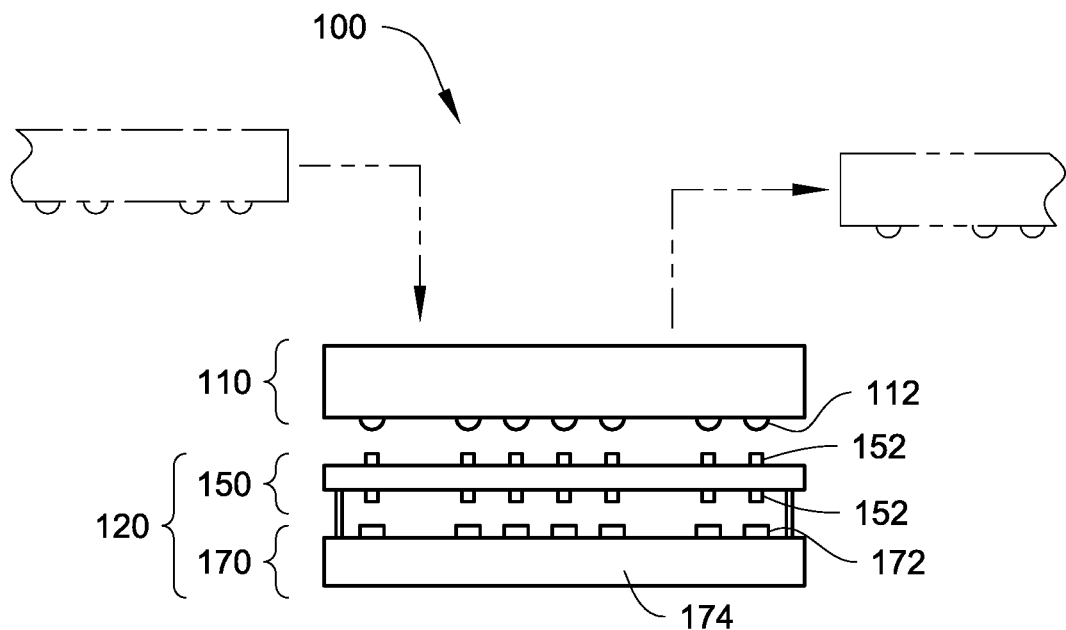
FIG. 2A is a side-view drawing of a portion of the test system for receiving a DUT for electrical testing, according to an embodiment.
Figure 2B:
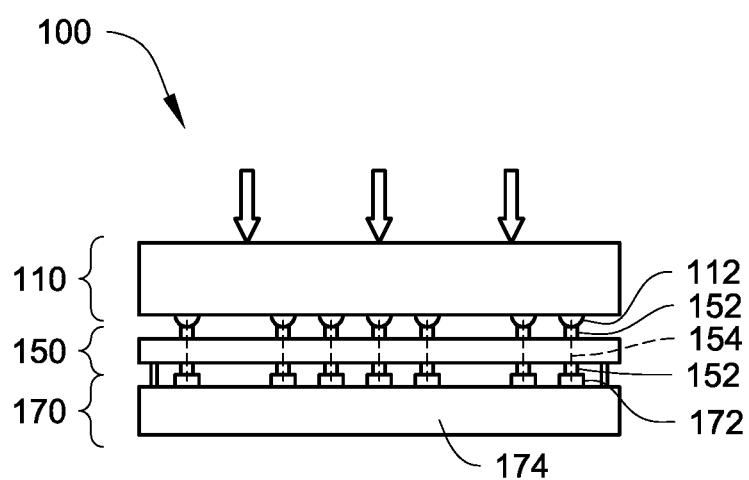
FIG. 2B is a side-view drawing of the test system of FIG. 2A, with the DUT electrically engaged, according to an embodiment.

FIG. 2A is a side-view drawing of a portion of the test system 100 for receiving the DUT 110 for electrical testing, according to an embodiment. FIG. 2B is a side-view drawing of the test system 100 of FIG. 2A, with the DUT 110 electrically engaged, according to an embodiment.

As shown in FIG. 2A, the DUT 110 is placed onto the test assembly 120, electrical testing is performed, and the DUT 110 is then removed from the test assembly 120. Any electrical connections are made by pressing components into electrical contact with other components; there is no soldering or de-soldering at any point in the testing of the DUT 110. The entire electrical test procedure may only last about a fraction of a second, so that rapid, accurate placement of the DUT 110 becomes important for ensuring that the test system 100 is used efficiently. The high throughput of the test assembly 120 usually requires robotic handling of the DUT 110. In most cases, an automated mechanical system places the DUT 110 onto the test assembly 120 prior to testing, and removes the DUT 110 once testing has been completed. The handling and placement mechanism may use mechanical and optical sensors to monitor the position of the DUT 110, and a combination of translation and rotation actuators to align and place the DUT 110 on or in the test assembly 120. Alternatively, the DUT 110 may be placed by hand, or placed by a combination of hand-fed and automated equipment.

The DUT 110 typically includes signal and power terminals 112 (see also terminals 112 of FIG. 1B) that connect to the socket 150 or other PCBs. The terminals may be on one side of the DUT 100, or may be on both sides of the DUT 110. For use in the test assembly 120, all the terminals 112 should be accessible from one side of the DUT 110, although it will be understood that there may be one or more elements on the opposite side of the DUT 110, or that there may be other elements and/or terminals on the opposite side that may not be tested by accessing terminals 112. Each terminal 112 is formed as a small, pad on button side of the DUT 110 or possibly a lead (e.g., half-ball shaped) protruding from the body of the DUT 110. Prior to testing, the pad or lead 112 is attached to an electrical lead that connects internally to other leads, to other electrical components, and/or to one or more chips in the DUT. The volume and size of the pads or leads may be controlled quite precisely, and there is typically not much difficulty caused by pad-to-pad or lead-to-lead size variations or placement variations. During testing, the terminals 112 remain solid, and there is no melting or re-flowing of any solder.

The terminals 112 may be laid out in any suitable pattern on the surface of the DUT 110. In some cases, the terminals 112 may be in a generally square grid, which is the origin of an expression that describes the DUT 110, BGA, WL-CSP, QFN, DFN, TSOP, or DO for leaded parts. There may also be deviations away from a rectangular grid, including irregular spacing and geometries. It will be understood that the specific locations of the terminals may vary as needed, with corresponding locations of pads on the load board 170 and contacts on the socket 150 or housing being chosen to match those of the terminals 112. In general, the spacing between adjacent terminals 2 is in the range of 0.25 to 1.5 mm, with the spacing being commonly referred to as a "pitch". When viewed from the side, as in FIG. 2A, the DUT 110 displays a line of terminals 112, which may optionally include gaps and irregular spacing. These terminals 112 are made to be generally planar, or as planar as possible with typical manufacturing processes. In many cases, if there are chips or other elements on the DUT 110, the protrusion of the chips is usually less than the protrusion of the terminals 112 away from the DUT 110.

The test assembly 120 of FIG. 2A includes a load board 170. The load board 170 includes a load board substrate 174 and circuitry that is used to test electrically the DUT 110. Such circuitry may include driving electronics that can produce one or more AC voltages having one or more particular frequencies, and detection electronics that can sense the response of the DUT 110 to such driving voltages. The sensing may include detection of a current and/or voltage at one or more frequencies. In general, it is highly desirable that the features on the load board 170, when mounted, are aligned with corresponding features on the DUT 110. Typically, both the DUT 110 and the load board 170 are mechanically aligned to one or more locating features on the test assembly 120. The load board 170 may include one or more mechanical locating features, such as fiducials or precisely-located holes and/or edges, which ensure that the load board 170 may be precisely seated on the test assembly 120. These locating features typically ensure a lateral alignment (X, Y, see FIG. 1A) of the load board 170, and/or a longitudinal alignment (Z, see FIG. 1A) as well.

In general, the load board 170 may be a relatively complex and expensive component. The housing/test assembly 120 performs many functions including protecting the contact pads 172 of the load board 170 from wear and damage. Such an additional element may be an interposer socket 150. The socket 150 also mechanically aligns with the load board 170 with suitable locating features (not shown), and resides in the test assembly 120 above the load board 170, facing the DUT 110. The socket 150 includes a series of electrically conductive contacts 152, which extend longitudinally outward on either side of the socket 150. Each contact 152 may include a resilient element, such as a spring or an elastomer material, and is capable of conducting an electrical current to/from the load board 170 from/to the DUT 110 with sufficiently low resistance or impedance. Each contact 152 may be a single conductive unit, or may alternatively be formed as a combination of conductive elements. In general, each contact 152 connects one contact pad 172 on the load board 170 to one terminal 112 on the DUT 110, although there may be testing schemes in which multiple contact pads 172 connect to a single terminal 112, or multiple terminals 112 connect to a single contact pad 172. For simplicity, we assume in the text and drawings that a single contact 152 connects a single pad 172 to a single terminal 112, although it will be understood that any of the tester elements disclosed herein may be used to connect multiple contact pads 172 connect to a single terminal 112, or multiple terminals 112 to a single contact pad 172.

Typically, the socket 150 electrically connects the load board pads 172 and the bottom contact surface of the DUT 110. Although the socket 150 may be removed and replaced relatively easily, compared with removal and replacement of the load board 170, we consider the socket 150 to be part of the test assembly 120 for this document. During operation, the test assembly 120 includes the load board 170, the socket 150, and the mechanical construction that mounts them and holds them in place (not shown). Each DUT 110 is placed against the test assembly 120, is tested electrically, and is removed from the test assembly 120. A single socket 150 may test many DUTs 110 before it wears out, and may typically last for several thousand tests or more before requiring replacement. In general, it is desirable that replacement of the socket 150 be relatively fast and simple, so that the test assembly 120 experiences only a small amount of down time for socket replacement. In some cases, the speed of replacement for the socket 150 may even be more important than the actual cost of each socket 150, with an increase in tester up-time resulting in a suitable cost savings during operation.

FIG. 2A shows the relationship between the test assembly 120 and the DUTs 110. When each DUT 110 is tested, it is placed into a suitable robotic handler with sufficiently accurate placement characteristics, so that a particular terminal 112 on the DUT 110 may be accurately and reliably placed (in X, Y and Z, see FIG. 1A) with respect to corresponding contacts 152 on the socket 150 and corresponding contact pads 172 on the load board 170. The robotic handler (not shown) forces each DUT 110 into contact with the test assembly 120. The magnitude of the force depends on the exact configuration of the test, including the number of terminals 112 being tested, the force to be used for each terminal, typical manufacturing and alignment tolerances, and so forth. In general, the force is applied by the mechanical handler of the tester (not shown), acting on the DUT 110. In general, the force is generally longitudinal, and is generally normal of the load board 170.

FIG. 2B shows the test assembly 120 and DUT 110 in contact, with sufficient force being applied to the DUT 110 to engage the contacts 152 and form an electrical connection 154 between each terminal 112 and its corresponding contact pad 172 on the load board 170. As stated above, there may alternatively be testing schemes in which multiple terminals 112 connect to a single contact pad 172, or multiple contact pads 172 connect to a single terminal 112, but for simplicity in the drawings we assume that a single terminal 112 connects uniquely to a single contact pad 172.

Figure 3:
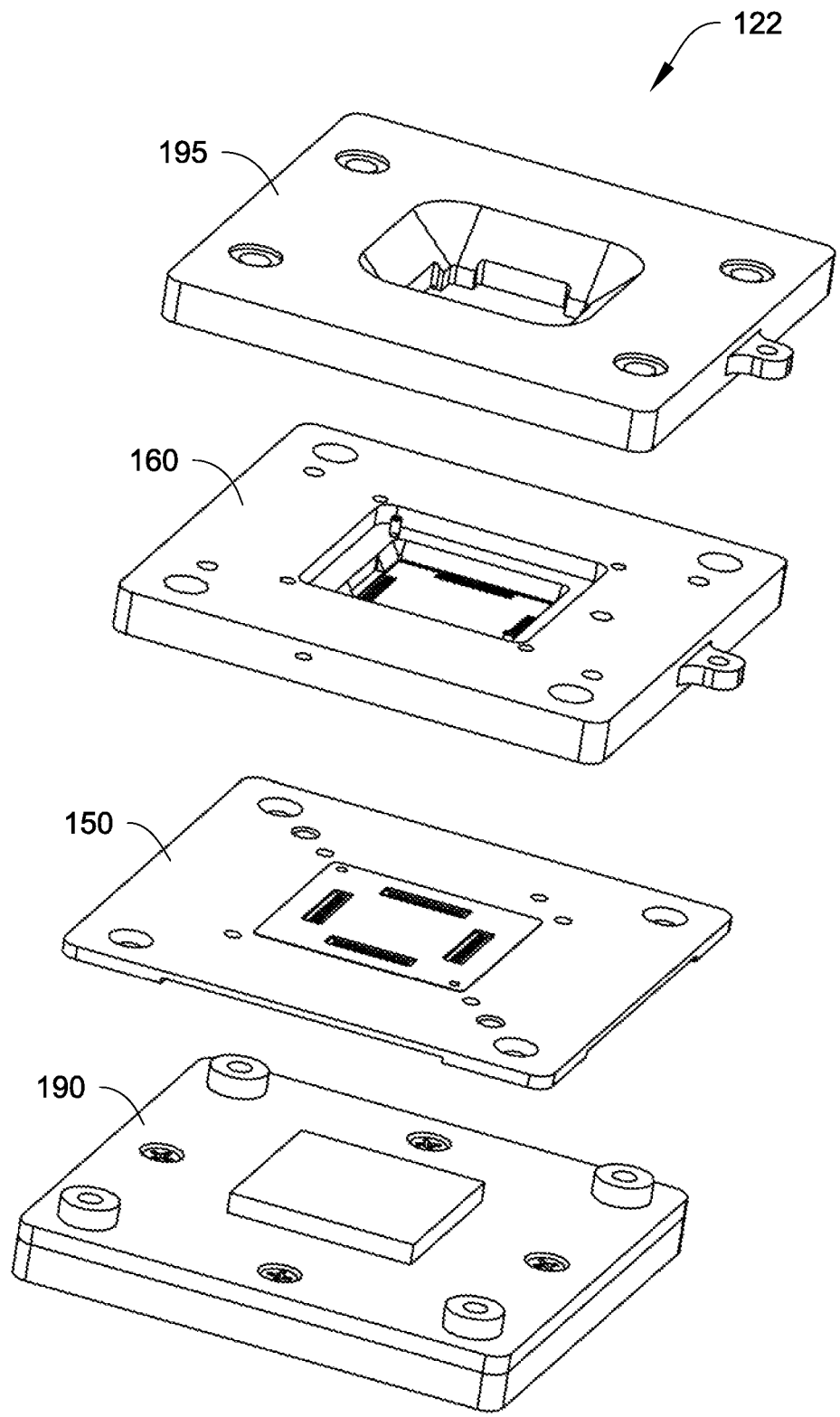
FIG. 3 is an exploded view of building blocks of a test contactor of a test assembly for the testing of a DUT, according to an embodiment.

FIG. 3 is an exploded view of the building blocks of a test contactor 122 of a test assembly 120 for the testing of a DUT, according to an embodiment. It will be appreciated that the connection assembly such as fasteners and/or parts that mount and manipulate the various building blocks of the testing assembly are not shown.

The test contactor 122 includes an optional stiffener 190, a socket 150, an alignment plate 160, and an optional clamping plate 195. The stiffener 190 can provide structural support to a load board (not shown also as known as daughter board, PCB, etc., see FIGS. 1A-2B) to minimize deflection to ensure socket 150 contacting with the load board. The load board is used to route signals from the DUT (via the socket 150) to a tester (not shown) or vice versa. The tester is used to test the DUT (e.g., by sending commands/inputs to the DUT and/or by receiving data/outputs from the DUT). The load board is mounted to a test head in the tester. In the test assembly 120, the load board is disposed between the stiffener 190 and the socket 150.

The socket 150 is used to provide a pathway for inputs/outputs of the DUT to the tester (via the load board). The device alignment plate 160 is to align the DUT to the socket 150. The alignment plate 160 is aligned and is attached to the stiffener 190 by e.g., fasteners that go through holes of the socket 150 and the load board. The alignment plate 160 has a recess/opening (e.g., in the middle of the alignment plate 150) with alignment features and a holder (e.g., Z direction up-stop) to hold the DUT and align the DUT to the socket 150 (so that the S&P pins/pads/leads/balls/lines/terminals of the DUT are aligned with the S&P pins/pads/leads/balls/lines/terminals of the socket 150).

The clamping plate 195 can be optional. The clamping plate 195 can hold the DUT firmly against the load board (via the alignment plate 160 and the socket 150) during testing. In one embodiment, vacuum (instead of the clamping plate 195) can be used as a hold down mechanism for the DUT. In another embodiment, the alignment of the DUT (by the alignment plate 160) can be made as flush as possible, and the DUT can be held at the corners rather than using a clamping plate.

Figure 4:
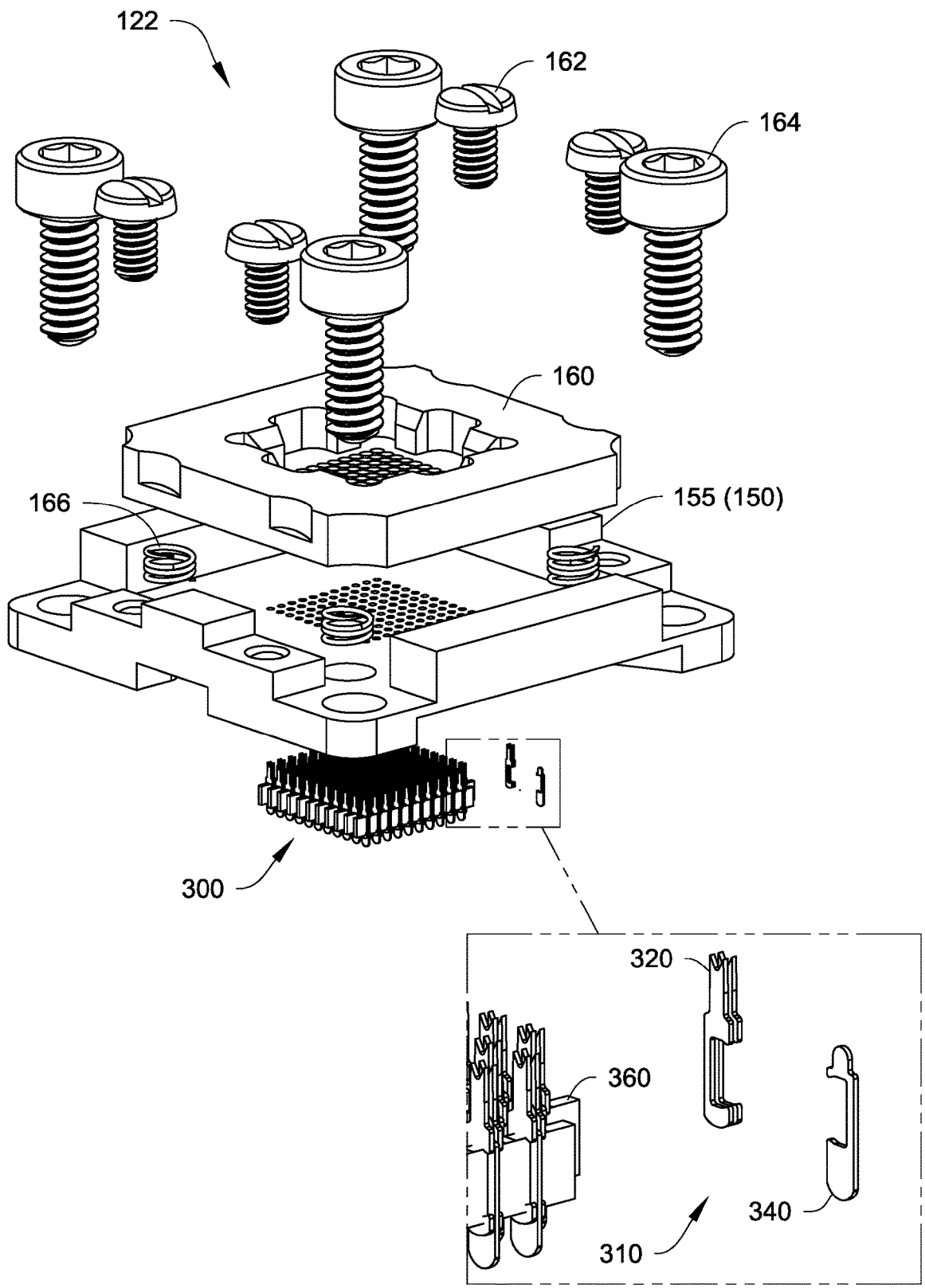
FIG. 4 is an exploded view of building blocks of a test contactor of a test assembly for the testing of a DUT, according to another embodiment.

FIG. 4 is an exploded view of the building blocks of a test contactor 122 of a test assembly 120 for the testing of a DUT, according to another embodiment.

The test contactor 122 includes fasteners such as alignment fasteners 162 and contactor fasteners 164, alignment plate (e.g., a floating alignment plate) 160, a housing 155 of a socket 150, elastic components (e.g., springs) 166, and a contact assembly array 300. The contact assembly array 300 includes an array of contact assemblies 310, where a couple of the contact assemblies 310 are enlarged. In an embodiment, each contact assembly 310 includes a pair of blades (DUT contact pair) 320, a blade (load board contact) 340, and an elastomer 360. In other embodiments, a contact assembly 310 can include more or less of blades (320, 340). For example, a contact assembly 310 can include a blade 320 and a blade 340. In another example, a contact assembly 310 can include two or more blade 320, and one or three or more blades 340.

The alignment fasteners 162 are configured to fasten the alignment plate 160 to the housing 155 of the socket 150, via e.g., recesses on the sides/edges of the alignment plate 160 and holes on the housing 155 of the socket 150. Elastic components (e.g., springs) 166 can be fixed on the housing 155, and disposed between the housing 155 and the alignment plate 160 so that the alignment plate 160 is a floating alignment plate. The contactor fasteners 164 are configured to fasten the housing 155 of the socket 150 to a load board (e.g., 170 of FIGS. 2A and 2B), via e.g., holes on the housing 155.

Figure 5B:
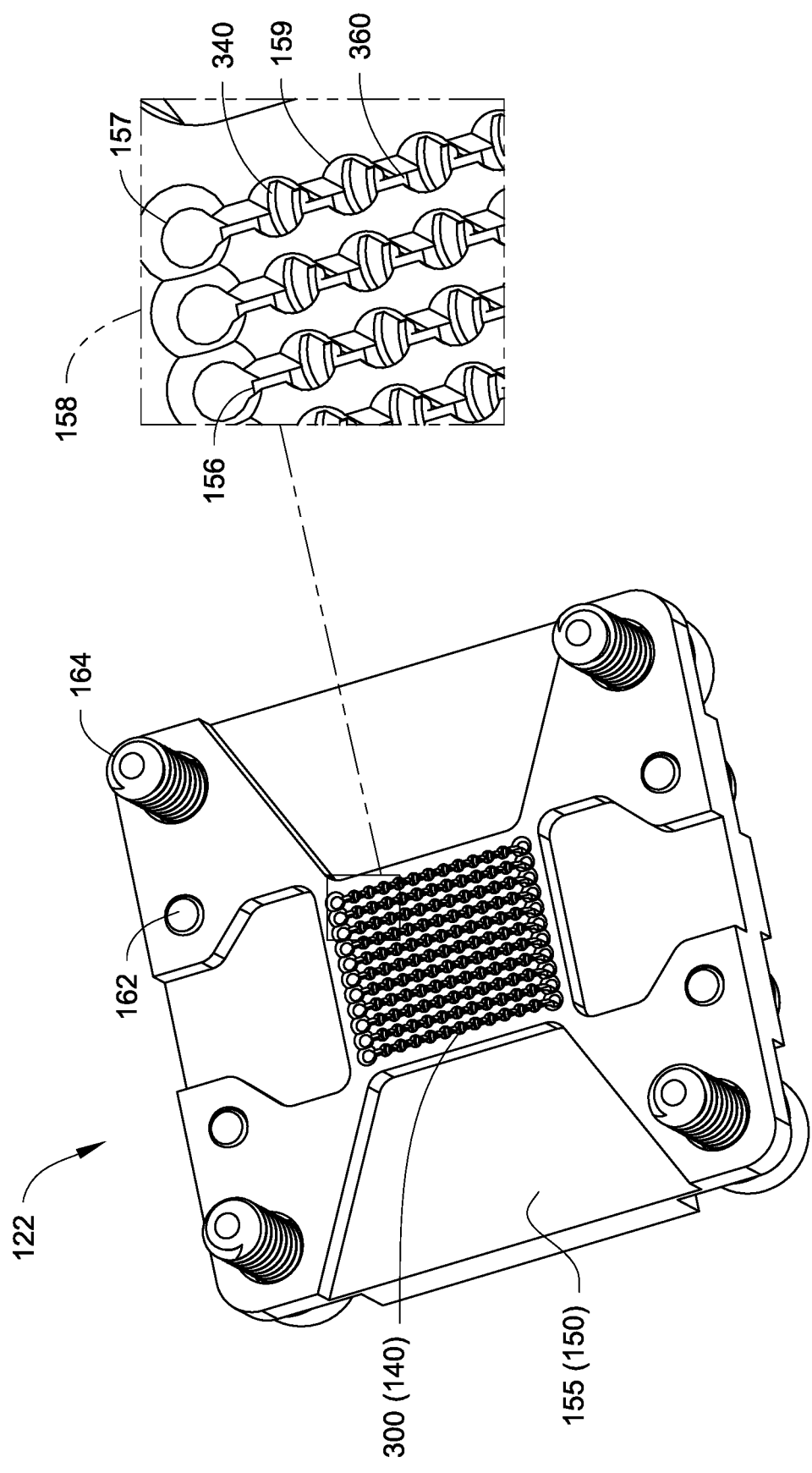
FIG. 5B is a bottom angle view of the assembled building blocks of a test contactor of a test assembly for the testing of a DUT, according to an embodiment.

The alignment plate 160 includes an array of holes (169 of FIG. 5A). As shown in FIG. 4, the array of holes (169 of FIG. 5A) are in the middle of the alignment plate 160 to accommodate e.g., S&P terminals (e.g., BGA terminals) of a DUT. In another embodiment, the array of holes (169 of FIG. 5A) can be in other area of the alignment plate 160 to accommodate S&P terminals of a DUT. The housing 155 of the socket 150 includes an array of holes (157 and 159 of FIG. 5B). As shown in FIG. 4, the array of holes (157 and 159 of FIG. 5B) are in the middle of the housing 155 to accommodate e.g., the contact assembly array 300. In another embodiment, the array of holes (157 and 159 of FIG. 5B) can be in other area of the housing 155 to accommodate the contact assembly array 300.

FIG. 5A is a top angle view of the assembled building blocks of a test contactor 122 of a test assembly 120 for the testing of a DUT, according to an embodiment. FIG. 5A is viewed at the DUT side, and a portion 168 of the test contact array 140 (see FIG. 1A) is enlarged. A DUT can be placed in/on the alignment plate 160 so that each of the S&P terminals of the DUT can be accommodated in each hole of the array of holes 169, respectively, and contact each pair of the blades (DUT contact pair) 320 in the contact assembly array 300. The contact assembly array 300 is installed in the housing 155 of the socket 150 and forms the test contact array 140.

FIG. 5B is a bottom angle view of the assembled building blocks of a test contactor 122 of a test assembly 120 for the testing of a DUT, according to an embodiment. FIG. 5B is viewed at the load board side, and a portion 158 of the test contact array 140 is enlarged. A load board can be placed under the housing 155 of the socket 150 so that each of the S&P terminals of the load board can contact each of the blade (load board contact) 340 in the contact assembly array 300, which is accommodated in each hole of the array of holes 159, respectively. The extension(s) 156 of the elastomer(s) 360 are configured to fix the contact assembly array 300 in place in the housing 155, by e.g., extending into the elastomer termination holes 157 and being fixed in the holes 157 via e.g., any suitable fastening mechanism. In another embodiment, 156 can be a component (e.g., strip, string, or the like) independent to the elastomer 360 to fix the contact assembly array 300 in place in the holes 157 of the housing 155.

The contact assembly array 300 includes an array of contact assemblies 310. Each row (or string, strip, or the like) of the contact assembly array 300 extends in a thickness direction (e.g., Y direction, see FIG. 1A) in terms of the blades (320, 340). In an embodiment, the contact assemblies 310 in each row of the contact assembly array 300 share an elongated elastomer 360 extending in the thickness direction (e.g., a contact assembly 310 includes blades (320, 340), and the contact assemblies 310 in the row share the elongated elastomer 360). The shared elastomer 360 in each row can extend further into the holes 157 at two ends of the row and being fixed in the holes 157 via e.g., any suitable fastening mechanism. In another embodiment, component 156, which can be independent to the elastomer 360, can be deployed to fix the contact assembly array 300 in place in the holes 157 of the housing 155. The rows of the contact assembly array 300 can be disposed in parallel to each other in a width direction (e.g., X direction, see FIG. 1A) in terms of the blades (320, 340). In another embodiment, the shared elastomer 360 in each row can include elastomer segments, each elastomer segment corresponding to a contact assembly 310 (e.g., a contact assembly 310 includes blades (320, 340) and an elastomer segment, see e.g., FIGS. 10A and 10B). The blades (320, 340) of each contact assembly 310 are accommodated in the holes 159 which extend in a longitudinal direction (e.g., Z direction, see FIG. 1A) in terms of the blades (320, 340).

FIG. 5C is a bottom view of a housing 155 of a socket 150 without the contact assembly array 300, according to an embodiment. FIG. 5C is viewed at the load board side, and a portion of the test contact array 140 is enlarged.

The housing 155 includes fastener holes (through holes 150a, 150b) to accommodate fastener (162, 164 of FIG. 4) to fix the housing 155 to the alignment plate 160 and to the load board 170, respectively. The housing 155 also includes decoupling pockets 150c at each of the four sides of the housing 155. In an embodiment, each decoupling pocket 150c can be a recess extending in the longitudinal direction (Z direction) to facilitate installation/removal of the housing 155 into/from the test contactor 122 or the test system 100.

The housing 155 further includes elastomer termination holes 157. The holes 157, which may or may not be through holes, extending from a bottom side of the housing 155 to a top side of the housing 155 in the longitudinal direction (Z direction), without penetrating the top side of the housing 155. At the bottom side of the housing 155, each hole 157 include an access countersink 150d, which can be an upper portion of an inverted (in Z direction) hollow conical shape, having an outer diameter greater than a diameter of the hole 157. In each row of the test contact array 140 in the housing 155, an elastomer slot 150e, which can be a recess extending from the bottom side of the housing 155 to the top side of the housing 155 in the longitudinal direction (Z direction), without penetrating the top side of the housing 155. The elastomer slot 150e is sized to accommodate the elastomer 360 (e.g., with a slight clearance between the elastomer 360 and the elastomer slot 150e to facilitate installation of the elastomer 360 and/or expansion of the elastomer 360 when the elastomer 360 is in a compressed state). The elastomer slot 150e also extends along the row of the test contact array 140 in the thickness direction (Y direction) and each end of the elastomer slot 150e is provided with a hole 157.

The housing 155 also includes contact counter-drill holes 159, which are not through holes, extending from the bottom side of the housing 155 to the top side of the housing 155 in the longitudinal direction (Z direction), without penetrating the top side of the housing 155. The housing 155 further includes contact tip locating holes 150f, which are through holes extending from the bottom side of the housing 155 to the top side of the housing 155 in the longitudinal direction (Z direction), each hole 150f located within each hole 159 and having a diameter smaller than a diameter of the hole 159. The portion between the outer diameter of the hole 159 and the outer diameter of the hole 150f is the up-stop 150g, which is configured to prevent the blades (320, 340) from moving out of the housing 155 in the Z direction toward the DUT. The elastomer slot 150e has a height lower than a height of the hole 157 and a height of the hole 159 in the Z direction.

It will be appreciated that embodiments disclosed herein provide a guiding fit (e.g., by the elastomer slot 150e) with the elastomer 360 to help center the row assembly of the contact assembly array 300 without over constraining the blade (320, 340) position, so that the housing locating hole 150f or the hole 159 may set the blade (320, 340) position. In an embodiment, the housing 155 requires another component or feature (e.g., 156) to retain the row assembly in place. In another embodiment, an interference fit (e.g., by the elastomer slot 150e) can retain the row assembly without additionally housing features. The interference fit may increase difficulty of elastomer installation. The interference fit can be along the entire elastomer slot 150e, or only near the ends of the elastomer slot 150e.

FIG. 6A is a side view of a DUT contact blade 320 of a contact assembly 310, according to an embodiment. FIG. 6B is a side view of a load board contact blade 340 of a contact assembly 310, according to an embodiment. FIG. 6C is a side view of an elastomer 360 of a contact assembly 310, according to an embodiment.

In an embodiment, each blade (320, 340) can be plated with e.g., gold, etc. In another embodiment, each blade (320, 340) may not be plated if the metal of the blade (320, 340) is metallurgically suitable. In an embodiment, each blade (320, 340) can be made of any conductive material such as copper, copper alloys, nickel alloys, steels, precious metals, etc. It will be appreciated that flexibility may not be a requirement with respect to the blade (320, 340). Elastomer 360 can be made of any elastic rubber-like material such as silicone, etc. In an embodiment, the elastomer 360 may be non-conductive. In another embodiment, the elastomer may also be conductive but only so long as it is non-conductive in portions between groups of blades, so that the group of blades does not short to other groups. If the exterior of the elastomer is conductive, then it must be non-conductive, such as by masking in those section between groups of blades. A group of blades may be, for example two blades with contact to a DUT and with a single blade configured to contact the load board, or the reverse. A group is not limited to three blades together, but may be as few as two and as many as DUT contact spacing will allow.

The DUT contact blade 320 includes a first end as a DUT interface. As shown in FIG. 6A, the DUT interface includes two tips 322 protruding in the longitudinal direction (Z direction). A groove 324 is disposed between the tips 322. In another embodiment, instead of having the tips 322 and the groove 324, the DUT interface of the blade 320 can be a curved or arc or convex tip (see FIGS. 13A-14B). The blade 320 also includes two shoulders 326 at each side of the blade 320, each shoulder 326 extending outwards in a width direction (X direction) from the first end. The blade 320 further includes an aperture (elastomer cavity) 332 to accommodate the elastomer 360. At one side of the aperture 332, an elastomer interface 330 of a guide arm 336 is provided. At another side of the aperture 332, an opening 329 is provided such that the aperture/recess or cutout 332 has a substantially C-shape. Note that blades 320 and 340 have a similar or identical aperture/recesses 332/352 for the elastomer. By assembling blades 320 and 340 into a stack were alternate blades have their apertures opening in opposite direction; the elastomer aperture will be completely surrounded/bounded by portions of the blades. In other words the C-bracket openings will be arranged with their opening edge being face to face, like "[ ]" having right and left hand opening, to create a two part complete or nearly complete boundary for the elastomer. C-shape includes any recess which is capable of receiving and retaining, at least in part, an elastomer.

Retention bumps or shoulders 328 are provided near two ends (preferably upper and lower ends) of the aperture 332 at the opening 329 side, and are configured to prevent the elastomer 360 from moving out of the aperture 332 after the elastomer 360 being accommodated in the aperture 332. The retention bumps protrude into the aperture space or add a "serif" to the outer edge of the aperture. The distance between the retention bumps 328 is smaller than a height of the elastomer 360 in the longitudinal direction (Z direction). The aperture 332 is sized to accommodate the elastomer 360 (e.g., with a slight clearance between the elastomer 360 and the aperture 332 to facilitate installation of the elastomer 360 and/or expansion of the elastomer 360 when the elastomer 360 is in a compressed state). The aperture 332 is disposed below a central line between the first end (the DUT interface) and the second end of the blade 320 in the height direction (Z direction) and is closer to the second end than to the first end (the DUT interface). A side (an internal electrical interface) 338 of the blade 320 is shown. The shoulders 326, the retention bumps 328, the guide arm 336, and the second end form a main body of the blade 320. The main body of the blade 320 has a width greater than a width of the first end of the blade 320. The second end of the blade 320 is a curved or arc or convex tip. In another embodiment, instead of having opening 329, each side of the aperture 332 can be provide with an elastomer interface 330 so that the aperture 332 is enclosed by a body of the blade 320 (see FIGS. 14A-14B).

The load board contact blade 340 includes a first end 344 as a load board interface. As shown in FIG. 6B, the load board interface 344 is a curved or arc or convex tip. The blade 340 also includes two shoulders 346 at each side of the blade 340, each shoulder 346 extending outwards in a width direction (X direction) from the second end 342. The blade 340 further includes an aperture (elastomer cavity) 352 to accommodate the elastomer 360. At one side of the aperture 352, an elastomer interface 350 of a guide arm 356 is provided. At another side of the aperture 352, an opening 349 is provided such that the aperture 352 has a substantially C-shape. Retention bumps or shoulders 348 are provided near two ends of the aperture 352 at the opening 349 side, and are configured to prevent the elastomer 360 from moving out of the aperture 352 after the elastomer 360 being accommodated in the aperture 352. The distance between the retention bumps 348 is smaller than a height of the elastomer 360 in the longitudinal direction (Z direction). The aperture 352 is sized to accommodate the elastomer 360 (e.g., with a slight clearance between the elastomer 360 and the aperture 352 to facilitate installation of the elastomer 360 and/or expansion of the elastomer 360 when the elastomer 360 is in a compressed state). The aperture 352 is disposed below a central line between the first end (the load board interface) 344 and the second end 342 of the blade 340 in the height direction (Z direction) and is closer to the second end 342 than to the first end (the load board interface) 344. A side (an internal electrical interface) 358 of the blade 340 is shown. The shoulders 346, the retention bumps 348, the guide arm 356, and the first end 344 form a main body of the blade 340. The main body of the blade 340 has a width greater than a width of the second end 342 of the blade 340. The second end 342 is a curved or arc or convex tip. In another embodiment, instead of having opening 349, each side of the aperture 352 can be provide with an elastomer interface 350 so that the aperture 352 is enclosed by a body of the blade 340 (see FIGS. 14A-14B).

The elastomer 360 includes a body 366 having two sides (362, 364) served as interfaces with the elastomer interfaces (330, 350) after the elastomer 360 is accommodated in the apertures (332, 352). The elastomer 360 also includes a top side 365 to accept a DUT shear force from the DUT via the blades (320, 340). The elastomer 360 further includes a bottom side 367 to accept a load board shear force from the load board via the blades (320, 340). As shown in FIG. 6C, the elastomer 360 can extend into the paper in the thickness direction (Y direction).

Figure 7A:
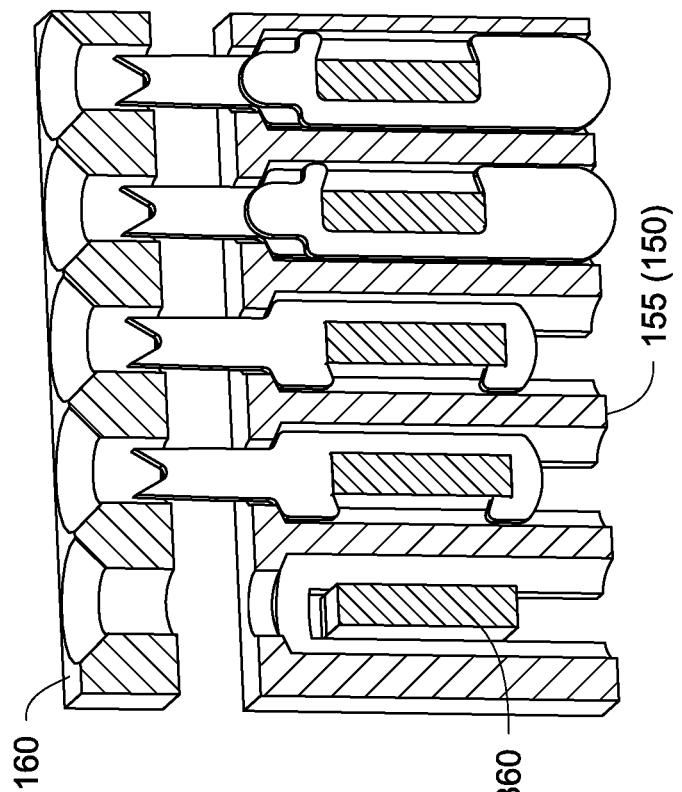
FIG. 7A is a sectional view of a contact assembly being installed in a housing of a socket and an alignment plate, according to an embodiment.
Figure 7B:
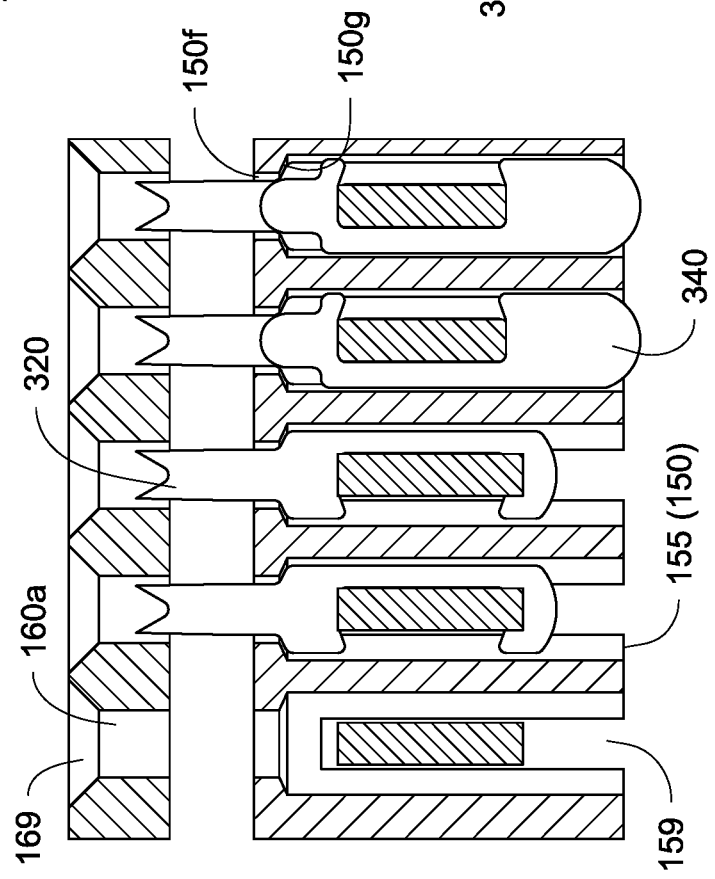
FIG. 7B is an angled sectional view of the contact assembly being installed in the housing of the socket and the alignment plate, according to an embodiment.

FIG. 7A is a sectional view of a contact assembly 310 being stacked in a housing 155 of a socket 150 and an alignment plate 160, according to an embodiment. FIG. 7B is an angled sectional view of the contact assembly 310 being stacked in the housing 155 of the socket 150 and the alignment plate 160, according to an embodiment.

In FIGS. 7A and 7B, from left to right, five steps of the contact assembly 310 being stacked in the housing 155 of the socket 150 and the alignment plate 160 are shown. The first step shows that the alignment plate 160 includes holes 169 and 160a. The hole 169 can be an upper portion of an inverted (in Z direction) hollow conical shape. The hole 160a can be a hollow cylinder shape. The contact counter-drill hole 159 and the contact tip locating through hole 150f of the housing 155 and the hole 160a of the alignment plate 160 are empty (i.e., no component is accommodated in the holes). The second step shows that the elastomer 360 is disposed in the hole 159. A width of the elastomer 360 is slightly smaller than a width of the elastomer slot 150e, and is much smaller than a diameter of the hole 159. The third step shows that a blade 320 is stacked with its aperture 332 accommodating the elastomer 360. A width of the main body of the blade 320 is slightly smaller than the diameter of the hole 159, but is larger than a diameter of the hole 150f so that the up-stop 150g can prevent the shoulders 326 of the blade 320 from being moving out of the hole 159 towards the DUT or alignment plate 160. The first end of the blade 320 protrudes in the Z direction through the hole 150f of the housing 155 and beyond the housing 155 into the hole 160a of the alignment plate 160 (see also FIG. 5A). The fourth step shows that a blade 340 is stacked with its aperture 352 also accommodating the elastomer 360 and with a side 358 contacting a side 338 of the blade 320. A width of the main body of the blade 340 is the same or similar to the width of the main body of the blade 320, is slightly smaller than the diameter of the hole 159, but is larger than a diameter of the hole 150f so that the up-stop 150g can prevent the shoulders 346 of the blade 340 from being moving out of the hole 159 towards the DUT or alignment plate 160. The first end 344 of the blade 340 protrudes in the Z direction through the hole 159 of the housing 155 and beyond the housing 155 for contacting with a load board. The fifth step shows that another blade 320 is stacked with its aperture 332 accommodating the elastomer 360 and with a side 338 contacting another side 358 of the blade 340. As shown in FIGS. 7A and 7B, the openings 329 of the blades 320 face an opposite direction to a direction the opening 349 of the blade 340 is facing.

It will also be appreciated that unless explicitly described herein, the components, material, size, attributes, arrangement, structure, and/or properties, etc. of the contact assembly array 300 and/or the contact assembly 310 are the same or similar to those of the contact assembly array 300 and/or the contact assembly 310 described in other embodiments.

It will further be appreciated that embodiments disclosed herein provide the elastomer 360 that is the compliant component which provides the vertical force to bias the blades (320, 340) away from each other to make and electrical connection between the terminals of the DUT and the terminals of the load board. The elastomer cross section with a rectangular and constant cross section for the length of the elastomer 360 allows the technology to fit on an array package with equal lead row pitch and equal lead column pitch. The constant cross section of the elastomer 360 allows for expansion of the elastomer 360 at high temperature with minimal effects of neighboring blades (320, 340). Additionally, the shape of the elastomer 360 is simple to manufacture with lower cost.

FIG. 8A illustrates views of a contact assembly 310 being assembled, according to an embodiment. FIG. 8B is an exploded view of a contact assembly 310 without the elastomer 360, according to an embodiment. FIG. 8B shows how the face to face orientation of the elastomer apertures surround the elastomer when assembled.

FIG. 8A, from right to left, illustrate (1) a side view of a pair of blade 320 and a blade 340 with their openings (329, 349) facing a same direction, (2) a side view of an elastomer 360 is accommodated in the apertures (332, 352) of the blades (320, 340), and (3) an angled view of (2). The elastomer 360 can have a through hole 361 extending from a side 362 to a side 364 of the elastomer 360 in the width direction (X direction). It will be appreciated that the hole (or cavity or the like) 361 within the body 366 of the elastomer 360 can be configured to allow and control the direction of elastomer expansion to manage force. The aperture 361 allows the elastomer to fill the void when compressed and provides for a more uniform resistance to the deformation. When the elastomer 360 is less constrained during compression, it can lower the elastomer force or keep it uniform. The hole 361 can be various shapes, and manufacturing can be easy with a constant cross-section hole in the elastomer in the X direction. The blade 340 is disposed between the pair of blades 320, such that the tips 322 and the grooves 324 of the blades 320 can form a crown shape to hold S&P terminals of e.g., a BGA DUT. When the blades 320 are pressed down by the terminals of the DUT (and the elastomer 360 is in a compressed state), the second end 342 of the blade 340 can also serve as a DUT contact support, together with the tips 322 and the grooves 324 of the blades 320.

Compared with openings (329, 349) facing opposite directions to each other, openings (329, 349) facing a same direction design can increase a width of the guide arms (336, 356) by arranging the guide arms (336, 356) on a same side of the elastomer 360 and use the housing 155 as a boundary condition for the apertures (332, 352). Such design can have a benefit to strengthen the guide arms (336, 356), at the cost of having the vertical force off center.

FIG. 9A is a perspective view of an elastomer 360, according to another embodiment. The elastomer 360 includes a plurality of castellations/recesses and lands (each including a pair of protrusions 369 with a recess 368 in between). The recesses are preferably sized to receive the upper and lower horizontal edges of apertures in the plurality (preferably three) of blades. In FIGS. 8A-B, two plates configured to contact the DUT are paired with a single blade configured to contact the load board, sandwiched between the DUT blades. The recesses 368 are spaced apart along the elastomer 360 to provide proper spacing/guide for the location of the blades relative to contacts on the DUT. Each castellation (368, 369) can provide a visual and physical aid to get a proper spacing of each of the contact assemblies 310 in a row assembly (that shares the elastomer 360) of the contact assembly array 300. An elastomer 360 with castellation (368, 369) at the shear force face can retain the contact assemblies 310 at e.g., an equal spacing before the row assembly of the contact assembly array 300 is installed in the housing 155. The installation of contact assemblies 310 into the individual contact locating holes 159 of the housing 155 can be quick since the blades (320, 340) of the contact assemblies 310 are not allowed to slide along the length of the elastomer in the Y direction. Also, since the position of the blades (320, 340) of the contact assemblies 310 does not need adjustment during the row assembly installation, the contact assemblies 310 are less likely to be damaged while laterally sliding the contact assemblies 310 into position.

It will be appreciated that castellation configurations on the elastomer 360 can be on the DUT shear force face (i.e., castellations provided on the side 365) only, the load board shear force face (i.e., castellations provided on the side 367) only, or both. Castellation configurations on the DUT shear force face may require a deeper up-stop hole (see FIG. 11) and be more difficult to manufacture and may increase electrical length compared with other configurations. The castellations can help distribute the elastomer 360 during assembly without bunching or stretching, which can affect the force due to increasing or decreasing the elastomer 360 displaced in the apertures (332, 352). The castellations can create a stress concentration at the corners of the castellations. Alternative castellation geometries with radius corners and cylindrical geometry can counteract stress concentrations due to sharp corners. It will also be appreciated that potential mismatch of the castellation pitch and locations with the contact locating holes 150f pitch and locations may occur, which may put additional side load on the blades (320, 340) which bias the blades (320, 340) against one side of the hole 150f.

FIG. 9B is a perspective view of an elastomer 360, according to yet another embodiment. The elastomer 360 includes a plurality of holes (or cavities or the like) 361 (see also FIG. 8A) compared with a solid elastomer without holes in the body of the elastomer 360, where the blade (320, 340) has an aperture (332, 352) that opens to one side of the blade (320, 340), and where the solid elastomer can expand laterally or into the blade (320, 340). With the holes 361, the elastomer 360 can expand towards the holes 361 when the elastomer 360 is compressed.

Figure 10B:
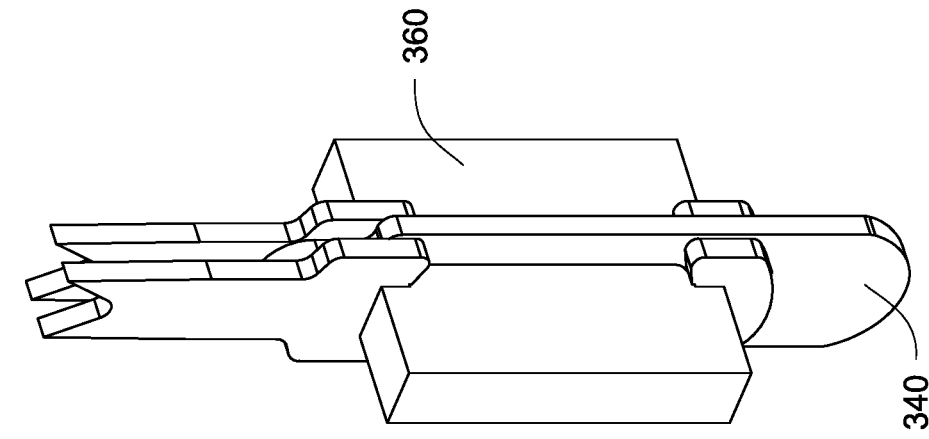
FIG. 10B illustrate a contact assembly being assembled, according to an embodiment.
Figure 10A:
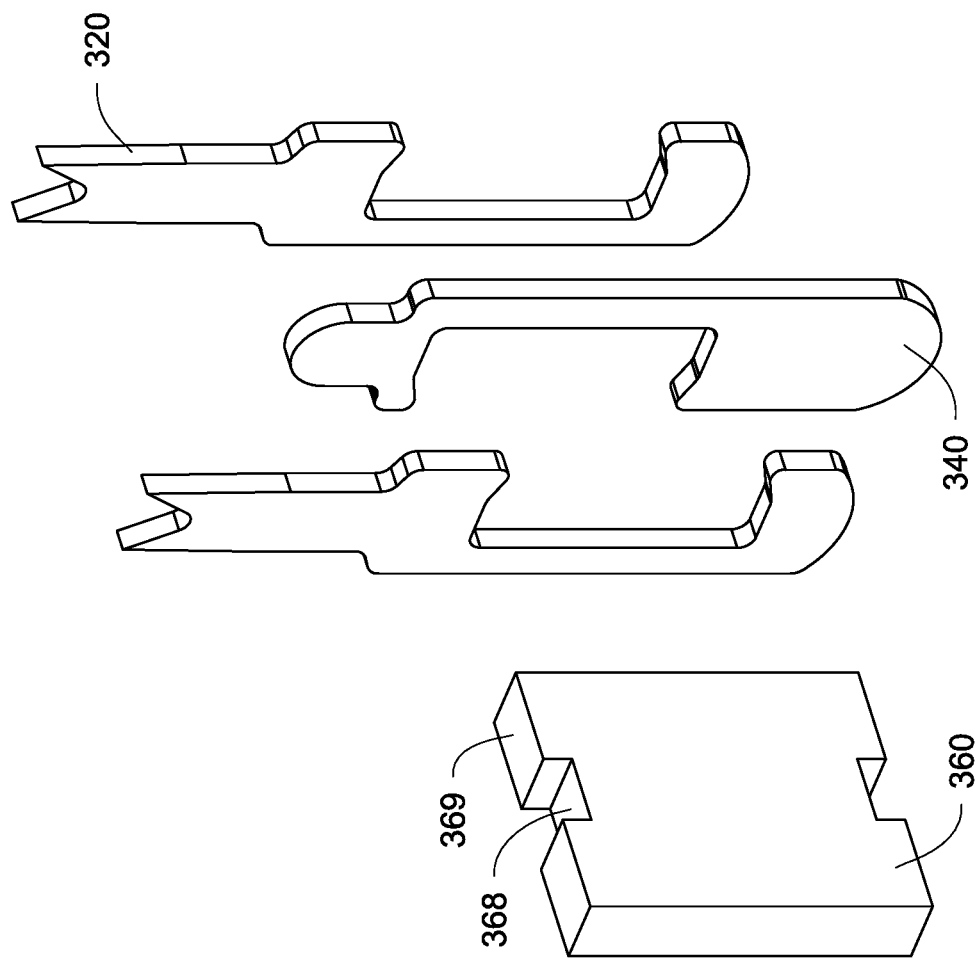
FIG. 10A is an exploded view of a contact assembly, according to an embodiment.

FIG. 10A is an exploded view of a contact assembly 310, according to an embodiment. FIG. 10B illustrate a contact assembly 310 being assembled, according to an embodiment. As shown in FIG. 10A, the elastomer 360 is an elastomer segment having a castellation (a pair of protrusions 369 with a recess 368 in between) at symmetric sides (365, 367) of the elastomer segment.

Use of elastomer segments instead of a shared elastomer can allow separation of contact assemblies 310 from each other and correction of order possible without disassembling neighboring blades (320, 340). In an embodiment, the elastomer segments can have castellations (368, 369) with lead-ins to allow the blades (320, 340) to snap into the narrow body portion that provides the force in shear.

FIG. 11 is sectional views of a contact assembly 310 being installed in a housing 155 of a socket 150 and an alignment plate 160, according to an embodiment. In FIG. 11, H1-H7 illustrate the depth/height/distance in the Z direction. H1 is the up-stop 150g depth measured from a bottom of the housing 155 to the up-stop 150g. H2 is a minimum thickness to withstand pre-load of the contact assembly 310 measured from a top surface of the hole 150f to the up-stop 150g. H3 is the stroke of the load board contact (caused by movement of the blade 340, measured from the shoulder 346 in an uncompressed state to the up-stop 150g). H4 is a castellation height measured from a top surface of the protrusion 369 to a bottom surface of the recess 368 of the castellation. H5 is a height of the aperture (332, 352) measured from one end to the other end of the aperture (332, 352). H6 is a shoulder height measured from the second end of the blade 320 in an uncompressed state to the top surface of the protrusion 369. H7 is the stroke of the DUT contact (caused by movement of the blade 320, measured from the second end of the blade 320 in an uncompressed state to the bottom of the housing 155).

It will be appreciated that embodiments disclosed herein provide aperture (332, 352) that displaces elastomer volume to create the DUT and load board interface forces. The effective height of the aperture (332, 352) for the elastomer 360 may change with installation on the load board and actuation of the DUT to provide compliance. Additionally, the effective height of the aperture (332, 352) for the elastomer 360 may adjust the preload on the load board. The elastomer 360 is constrained by the blade(s) 320 and the blade 340, with the guide arms (336, 356) on opposing sides of the elastomer 360. The width of the aperture (332, 352) is constant during actuation, at free/uncompressed state there can be horizontal clearance between the elastomer contact interface (330, 350) of the blades (320, 340) and the elastomer 360. As the elastomer 360 is engaged vertically, it expands horizontally and increasingly interferes with the aperture (332, 352) and pushes the blades (320, 340) outward against the contact locating hole 150f or the hole 159 of the housing 155.

It will also be appreciated that embodiments disclosed herein provide aperture (332, 352) open to one side. The opening (329, 349) allows for easy assembly of the blades (320, 340) onto the elastomer, allowing installation of blades (320, 340) in any order, and correction of orientation or order of blades (320, 340) without disassembly of neighboring blades (320, 340). The elastomer 360 can expand into the opening (329, 349) due to deformation of elastomer 360 under load or thermal expansion. Two blade 320 and one blade 340 configuration can provide a tight pitch, and the blades 320 are symmetrical to center on a DUT with e.g., solder balls.

FIG. 12 is a schematic view of a contact assembly array 300 showing the elastomers 360 on diagonal and with blades (320, 340) nested at a tighter pitch than can be achieved with orthogonal strips/rows of the contact assembly array 300, according to an embodiment. It will be appreciated that embodiments disclosed herein can provide contact assembly array 300 nested for to match smaller DUT lead arrays with equal row and column spacing, or packages with perimeter leads such as QFN, DFN, DO, TSOP, or the like.

FIG. 13A is a perspective view of a contact assembly 310 in an unactuated (or uncompressed, free, or the like) state, according to an embodiment. In FIG. 13A, the contact assembly 310 is assembled and has not been installed in the housing 155 of the socket 150 yet.

FIG. 13B is a perspective view of a contact assembly 310 in a preload actuated (or partially compressed or the like) state, according to an embodiment. In FIG. 13B, the contact assembly 310 is assembled and is installed in the housing 155 of the socket 150, where pre-load forces from the load board 170 exert on the blades (320, 340) and cause the elastomers 360 to be partially compressed.

FIG. 13C is a perspective view of a contact assembly 310 in a fully actuated (or compressed or the like) state, according to an embodiment. In FIG. 13C, the contact assembly 310 is assembled and is installed in the housing 155 of the socket 150, and the DUT 110 and the load board 170 are attached to the test assembly 122 so that the forces from the terminals of the DUT 110 and of the load board 170 exert on the blades (320, 340) and cause the elastomers 360 to be fully compressed.

In FIGS. 13A-13C, instead of having the tips and the groove, the DUT interface of the blade 320 can be a curved or arc or convex tip. Forces exerted from both the DUT 110 and the load board 170 can compress the contact assembly 310 by compressing the elastomer 360. The elastomer 360 may compress perpendicularly to the compression axis (in the height direction Z) and the flow of the elastomer 360 may move into the clearances in the hole 159 of the housing 155.

The blades (320, 340) slide up and down against each other when force is applied to compress the elastomer 360. When being compressed, the elastomer 360 installed in the apertures (332, 352) compresses and shears. Each blade (320, 340) slides against the mating (adjacent) blade. Some of the elastomeric resilience is taken up by a shear-type deformation of the elastomer 360. When being compressed, the elastomer 360 can slightly bulge into the clearances in the hole 159, rather than shear.

Figure 14B:
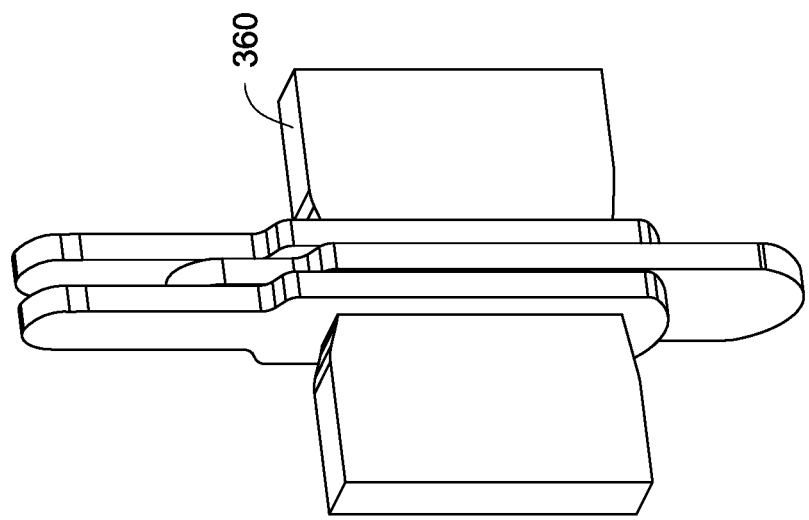
FIG. 14B is a perspective view of a contact assembly being assembled, according to an embodiment.
Figure 14A:
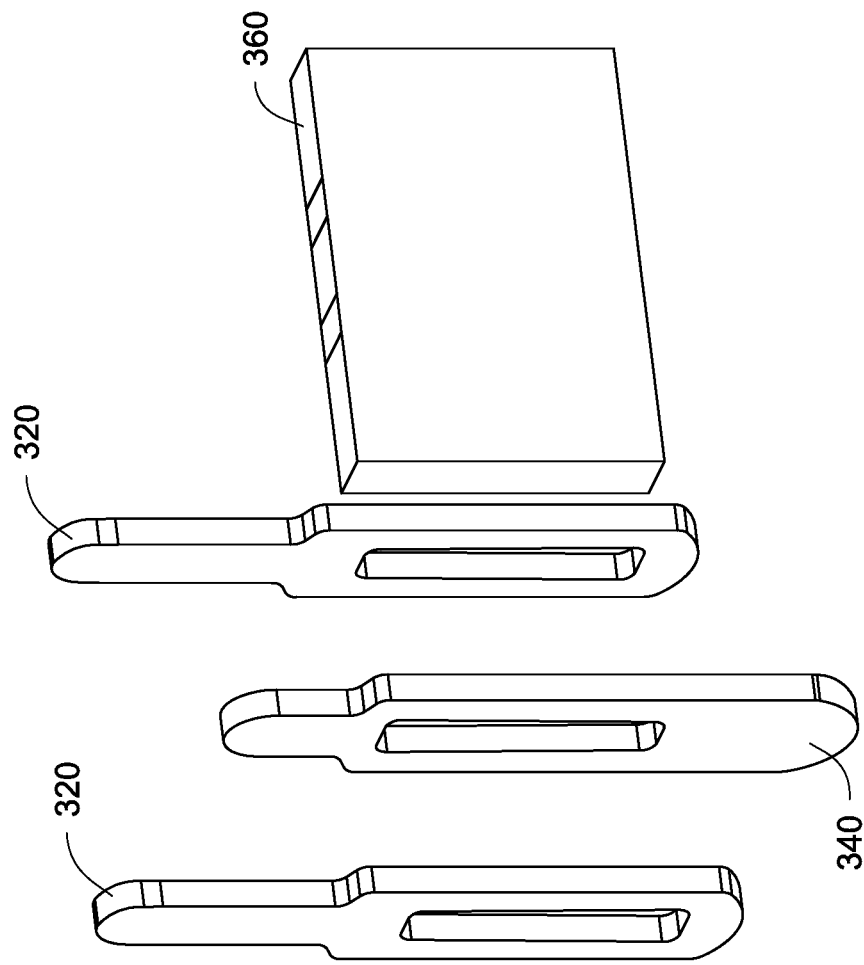
FIG. 14A is an exploded view of a contact assembly, according to an embodiment.

FIG. 14A is an exploded view of a contact assembly 310, according to an embodiment. FIG. 14B is a perspective view of a contact assembly 310 being assembled, according to an embodiment. As shown in FIGS. 14A and 14B, instead of having the tips and the groove, the DUT interface of the blade 320 can be a curved or arc or convex tip. Instead of having an opening, each side of the aperture (332, 352) can be provided with an elastomer interface 350 so that the aperture (332, 352) is enclosed by a body of the blade (320, 340).

Enclosing the aperture (332, 352) of each blade (320, 340) with a partial or full length arm (336, 356) on the open side (see FIGS. 13A-13C) can increase forces of the elastomer 360 on the DUT 110 and the load board 170 by constraining the elastomer deformation and increasing elastomer stress in the body of the elastomer 360. Enclosing the elastomer 360 with the body of the blade (320, 340) (see FIGS. 14A-14B) can cause the elastomer stress due to thermal expansion or vertical loading to transfer laterally to expand the guide arms (336, 356) outward. It is important the guide arms (336, 356) do not permanently deform and also withstand the cycle count required by typical test applications. As shown in FIGS. 14A-14B, the blades (320, 340) are symmetrical around the vertical axis, and therefore can be installed and function electrically in the installed orientations.

It will be appreciated that installation with enclosed aperture (332, 352) requires threading the DUT contact blade 320 and the load board contact blade 340 in a specific order and orientation to function. Preloaded blades (320, 340) require stretching and compressing the elastomer 360 to install the elastomer 360 inside the enclosed aperture (332, 352). Correcting the orientation or order of blades (320, 340) requires disassembly of neighboring blades (320, 340). Such design may work best with rectangular elastomer 360 without castellations, as the height of the elastomer 360 between contact shear interfaces is higher than and requires more elastomer compression to install inside the blades (320, 340) than at the shear force interface.

Figure 15C:
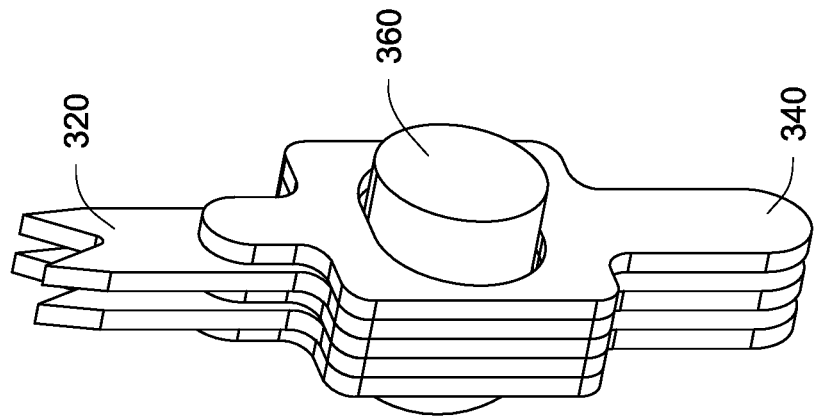
FIG. 15C is perspective view of a contact assembly, according to yet another embodiment.
Figure 15B:
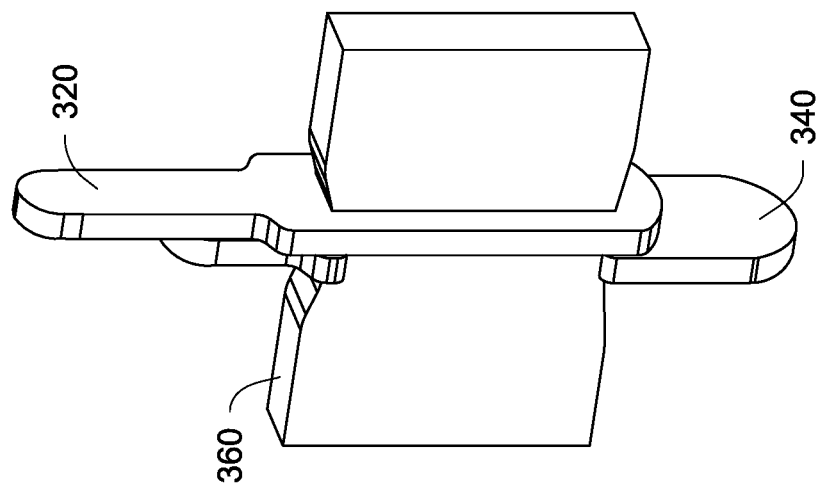
FIG. 15B is perspective view of a contact assembly, according to another embodiment.
Figure 15A:
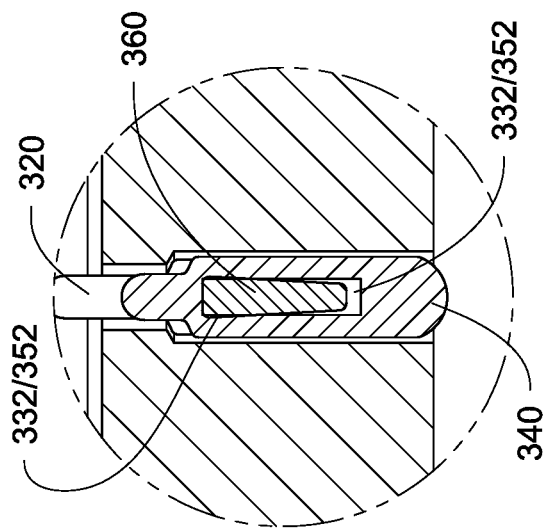
FIG. 15A is side view of a contact assembly, according to an embodiment.

FIG. 15A is side view of a contact assembly 310, according to an embodiment. The aperture (332, 352) is enclosed and is a taper aperture at one or two ends of the aperture (332, 352). The aperture (332, 352) with a taper can help minimize need to preload of the elastomer 360 in horizontal direction and increase the horizontal load as the DUT actuates. Since the elastomer 360 can flow into other nearby areas when compressed, then compressing the elastomer 360 horizontally may affect vertical forces, therefore the horizontal elastomer displacement can be used to tune DUT interface forces and the forces of the blades (320, 340) in the locating hole 150f or the hole 159, to minimize wear and guide blade (320, 340) motion. The taper can be formed by narrowing the resultant opening between the blade sandwich of three blades. The interior vertical sidewall of the guide arm 330,356 may be slanted inwardly or outwardly to create a taper toward the top (DUT end) or the bottom (load board end). The taper may be on all three blades or just one or two. The tapers can all be in the same direction or reversed from blade to blade.

FIG. 15B is perspective view of a contact assembly 310, according to another embodiment. As shown in FIG. 15B, the contact assembly 310 includes one blade 320 and one blade 340. Such design may have an imbalance of forces on the load board contact (i.e., first end 344 of the blade 340), with the elastomer 360 in shear only at one face of the load board contact, instead of shear forces on both sides of the load board contact.

FIG. 15C is perspective view of a contact assembly 310, according to yet another embodiment. As shown in FIG. 15C, the contact assembly 310 includes two or more blades 320 and more than one blade 340, and alternating by blade type has advantages of redundancy. Such design can provide additional thickness increasing up the lowest possible DUT lead pitch that can be covered, but can beneficially add current carrying capability, and add redundancy of possible electrical paths in the internal electrical interfaces. The aperture shape is show alternatively as round and the elastomer would be cylindrical.

It will be appreciated that in an embodiment, combination of an enclosed aperture (332, 352) with a round elastomer can make orientation of the blade (320, 340) fixable in situ. The round elastomer can drive a wider contact to the row to column pitch ratio deviates from nearly equal, so the design is suitable for peripheral pad devices, or arrays with large pitch, or arrays where ratio of column pitch to row pitch is much greater or much lower than one.

Figure 16A:
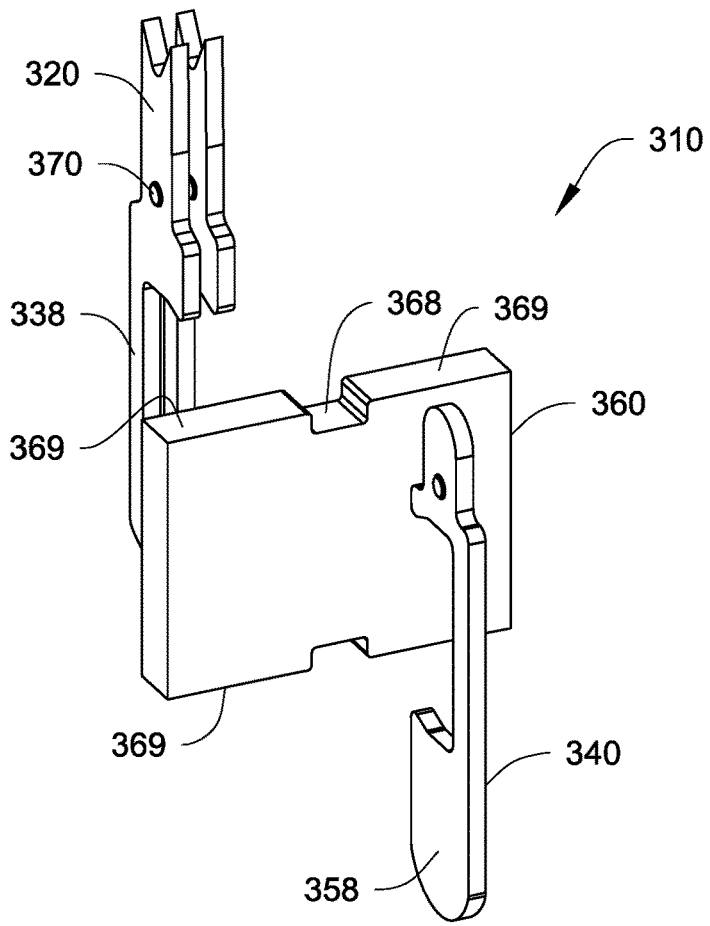
FIG. 16A is a perspective view of a contact assembly, according to an embodiment.
Figure 16B:
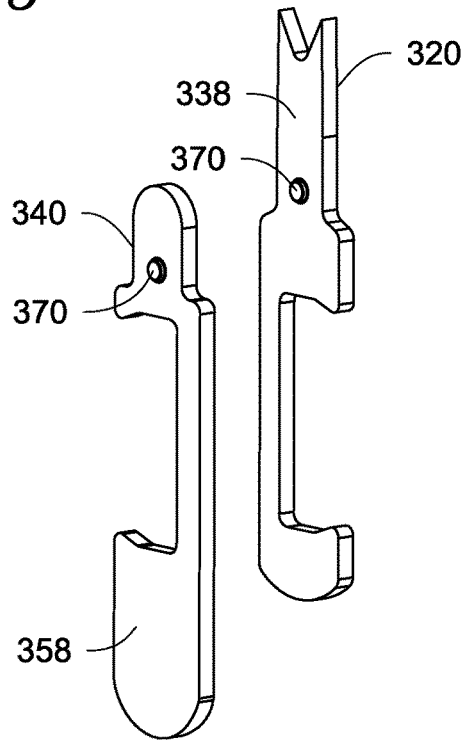
FIG. 16B is a perspective view of a contact assembly without the elastomer, according to an embodiment.
Figure 16C:
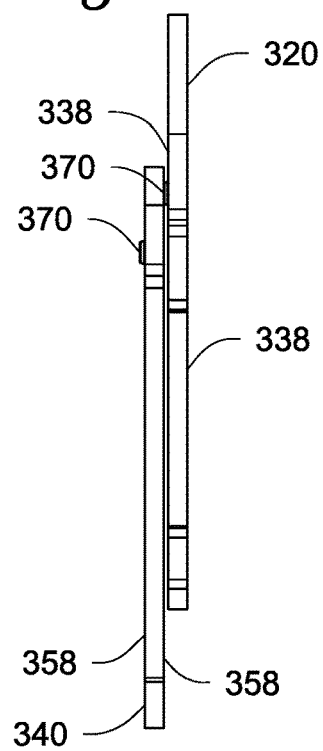
FIG. 16C is an end view of FIG. 16B, according to an embodiment.

FIG. 16A is a perspective view of a contact assembly 310, according to an embodiment. FIG. 16B is a perspective view of a contact assembly 310 without the elastomer, according to an embodiment. FIG. 16C is an end view of FIG. 16B, according to an embodiment.

In an embodiment, the blades (320, 340) can include bump(s) 370 at sides (338, 358). It will be appreciated that bump(s) 370 may be part of the same material as the blade and are fabricated in the same process as the blade. The thickness of the bump(s) 370 may be generally at or less than 10% of the thickness of the blade. Each bump 370 can have a circular or any other suitable shape and extends (or is raised) in the thickness direction. The bump(s) 370 can ensure electrical reliability (e.g., electrical connection reliability) from blade to blade, and focus the contact points to specific spots to guarantee reliable connection and provide some compliance in the blades stack-up. It will be appreciated that the bump(s) 370 can help to maintain good electrical contact among flat blades. Flat blades slide up and down when compressed or uncompressed, and the biasing of the blades to each other is critical. If there are some debris between the two blades, the debris can decrease the electrical conductivity between the two blades. The bump(s) 370 can help to improve the electrical connection between the blades on the load board side or on the DUT side. The bump(s) 370 can put high stress points through the blades.

As shown in FIGS. 16A-16C, one bump 370 is disposed at one side 338 of one DUT blade 320. It will be appreciated that one or more bumps 370 can be disposed at any suitable location(s) on one or more sides (338, 358) of one of more of the blades (320, 340). It will also be appreciated that the one or more bumps 370 sliding against mating surface (the surface of the side (338, 358) of the adjacent blade (320, 340) with which the bump(s) 370 is contacting) during actuation can provide proper electrical contact by concentrating pressure on a defined area.

Figure 17A:
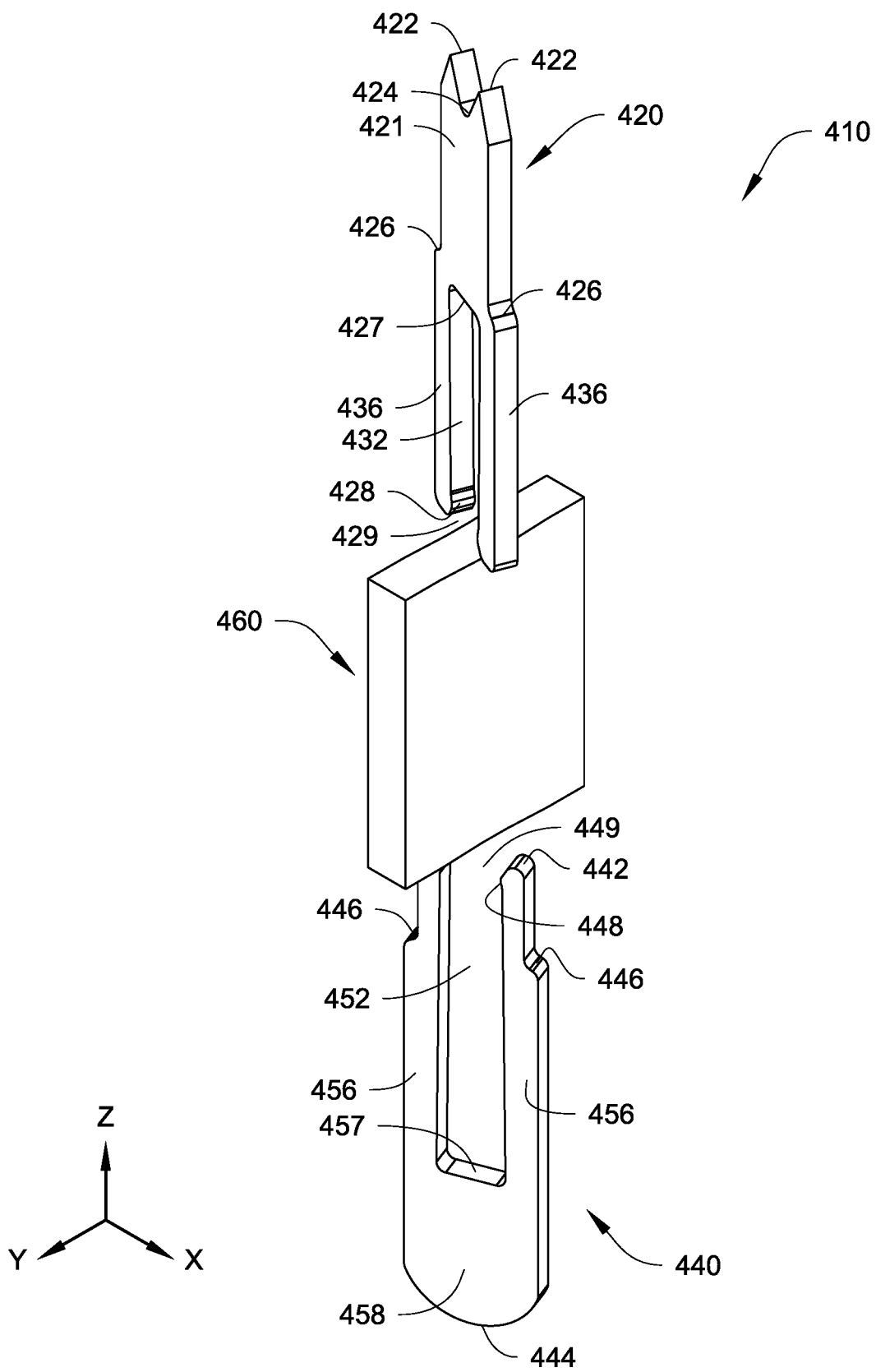
FIG. 17A is an exploded perspective view of a contact assembly, according to an embodiment.

FIG. 17A is an exploded perspective view of a contact assembly 410, according to an embodiment. FIGS. 17B-17E are perspective views of the contact assembly 410 of FIG. 17A being assembled and in an uncompressed state, according to an embodiment. FIGS. 17F-17I are perspective views of the contact assembly 410 of FIG. 17A being assembled and in a compressed state, according to an embodiment. FIG. 17J is a perspective view of the contact assembly 410 of FIG. 17A being assembled and in a partially compressed state.

The contact assembly 410 includes a DUT contact blade 420, a load board contact blade 440, and an elastomer 460. It will be appreciated that the structure, the arrangement, the material(s), and the configuration of the contact assembly 410, the DUT contact blade 420, the load board contact blade 440, and the elastomer 460 can be respectively the same as or similar to the contact assembly 310, the DUT contact blade 320, the load board contact blade 340, and the elastomer 360 described herein, except the differences described below.

The DUT contact blade 420 includes a first end as a DUT interface. As shown in FIG. 17A, the DUT interface includes two tips 422 protruding in the longitudinal direction (Z direction). A groove/notch 424 which can have a V-shaped or arcuate bottom trough, is disposed between the tips 422. In another embodiment, instead of having the tips 422 and the groove 424, the DUT interface of the blade 420 can be a curved or arc or convex tip (see FIGS. 13A-14B). The blade 420 may also include two shoulders 426 at each side of the blade 420, each shoulder 426 extending outwards in a width direction (X direction) from the first end. The thickness direction (from a first main surface 421 to a second main surface (not shown) opposite of the first main surface 421) of the blade 420 is the Y direction. The blade 420 further includes an aperture (elastomer cavity) 432 to accommodate the elastomer 460. The elastomer is shown as a rectangular block, but may be other shapes such as cylindrical, oblong, etc., and the aperture 432 may be made to conform to such shapes rather than being formed between two parallel straight guide arms/tines 436 as shown. At each side of the aperture 432, an elastomer interface of a guide arm 436 is provided. At the bottom of the aperture 432, an opening 429 is provided such that the aperture/recess or cutout 432 has a substantially n-shape (or a substantially upside down U-shape). Note that blades 420 and 440 have a similar or identical aperture/recesses 432/452 for the elastomer. It is also possible that the base/floor of the recess (427, 457) may be chamfered/canted or angled in a direction to promote the physical and electrical contact of the guide arms 436 which improves the electrical transmission therethrough because of the bias force creating a rotational vector driving the guide arms into contact with each other.

Retention bumps or shoulders 428 can be provided near two ends (preferably left and right ends) of the aperture 432 at the opening 429 side, and are configured to prevent the elastomer 460 from moving out of the aperture 432 after the elastomer 460 being accommodated in the aperture 432. The retention bumps protrude into the aperture space or add a "serif" to the outer edge of the aperture. The distance between the retention bumps 428 is smaller than a width of the elastomer 460 in the X direction. The aperture 432 is sized to accommodate the elastomer 460 (e.g., with a slight clearance between the elastomer 460 and the aperture 432 to facilitate installation of the elastomer 460 and/or expansion of the elastomer 460 when the elastomer 460 is in a compressed state). In an embodiment, the aperture 432 can be disposed below a central line between the first end (the DUT interface) and the second end of the blade 420 in the height direction (Z direction) and is closer to the second end than to the first end (the DUT interface). The shoulders 426, the retention bumps 428, and the guide arms 436 form a main body of the blade 420. The main body of the blade 420 has a width greater than a width of the first end of the blade 420.

The load board contact blade 440 includes a first end 444 as a load board interface. As shown in FIG. 17A, the load board interface 444 is a curved or arc or convex tip. The blade 440 also includes two shoulders 446 at each side of the blade 440, each shoulder 446 extending outwards in a width direction (X direction) from the second end 442. The blade 440 further includes an aperture (elastomer cavity) 452 to accommodate the elastomer 460. At each side of the aperture 452, an elastomer interface of a guide arm 456 is provided. At the top of the aperture 452, an opening 449 is provided such that the aperture 452 has a substantially U-shape with a flat or arcuate bottom. Retention bumps or shoulders 448 can be provided near two ends of the aperture 452 at the opening 449 side, and are configured to prevent the elastomer 460 from moving out of the aperture 452 after the elastomer 460 being accommodated in the aperture 452. The distance between the retention bumps 448 is smaller than a width of the elastomer 460 in the X direction. The aperture 452 is sized to accommodate the elastomer 460 (e.g., with a slight clearance between the elastomer 460 and the aperture 452 to facilitate installation of the elastomer 460 and/or expansion of the elastomer 460 when the elastomer 460 is in a compressed state). In an embodiment, the aperture 452 can be disposed below a central line between the first end (the load board interface) 444 and the second end 442 of the blade 440 in the height direction (Z direction) and is closer to the second end 442 than to the first end (the load board interface) 444. The shoulders 446, the retention bumps 448, the guide arms 456, and the first end 444 form a main body of the blade 440. The main body of the blade 440 has a width greater than a width of the second end 442 of the blade 440.

In an embodiment, the height of the aperture 432 can be less than the height of the elastomer 460. The height of the aperture 452 can be greater than the height of the elastomer 460.

Figure 17B:
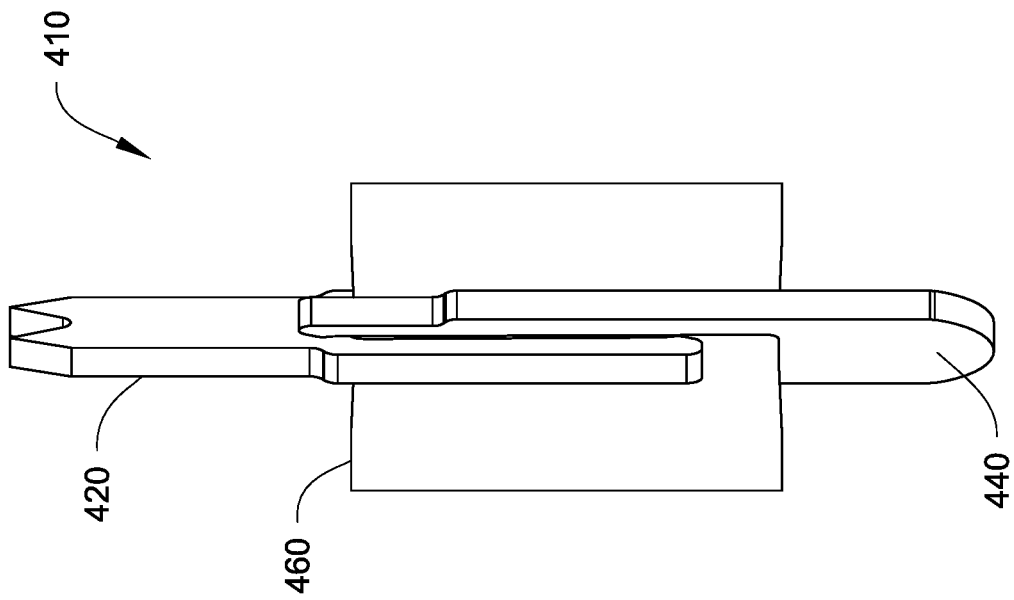
FIGS. 17B-17E are perspective views of the contact assembly of FIG. 17A being assembled and in an uncompressed state, according to an embodiment.
Figure 17C:
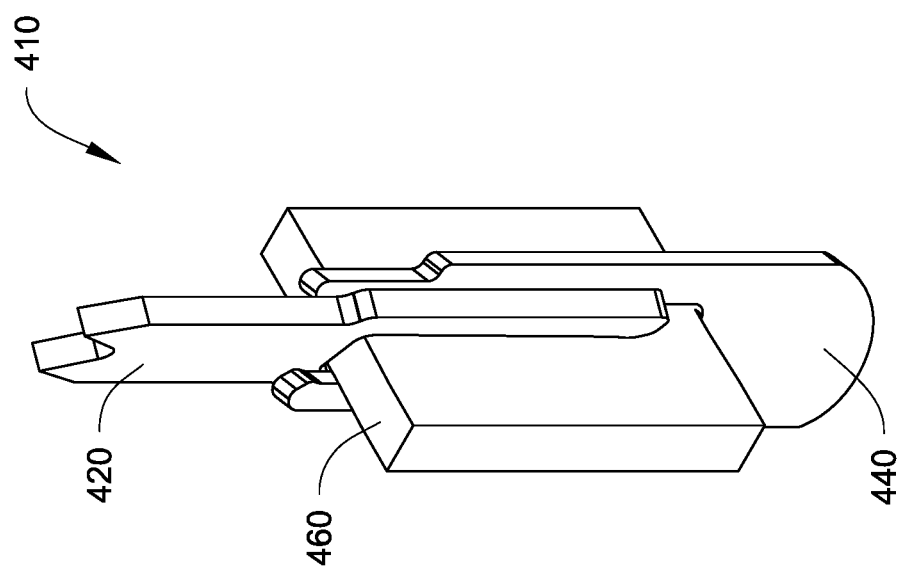
Figure 17E:
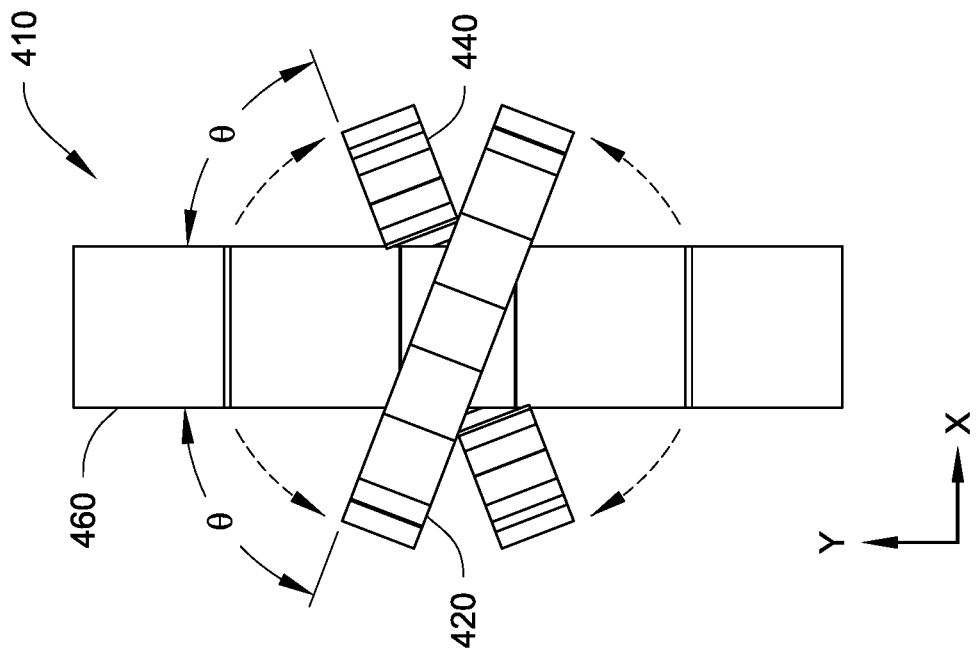
Figure 17D:
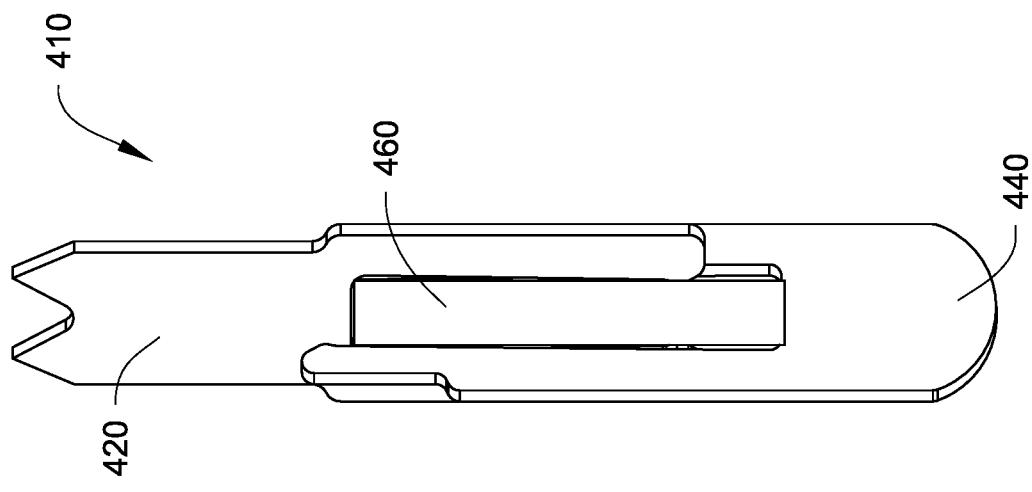
Figure 17I:
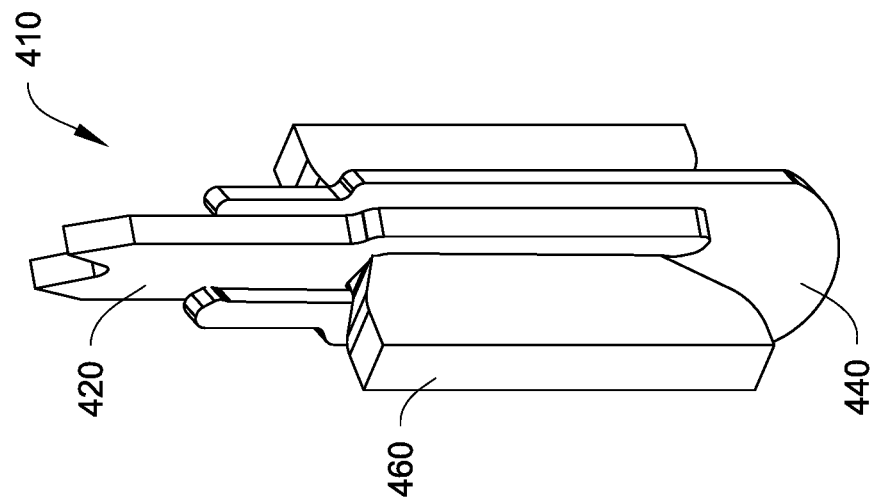
Figure 17J:
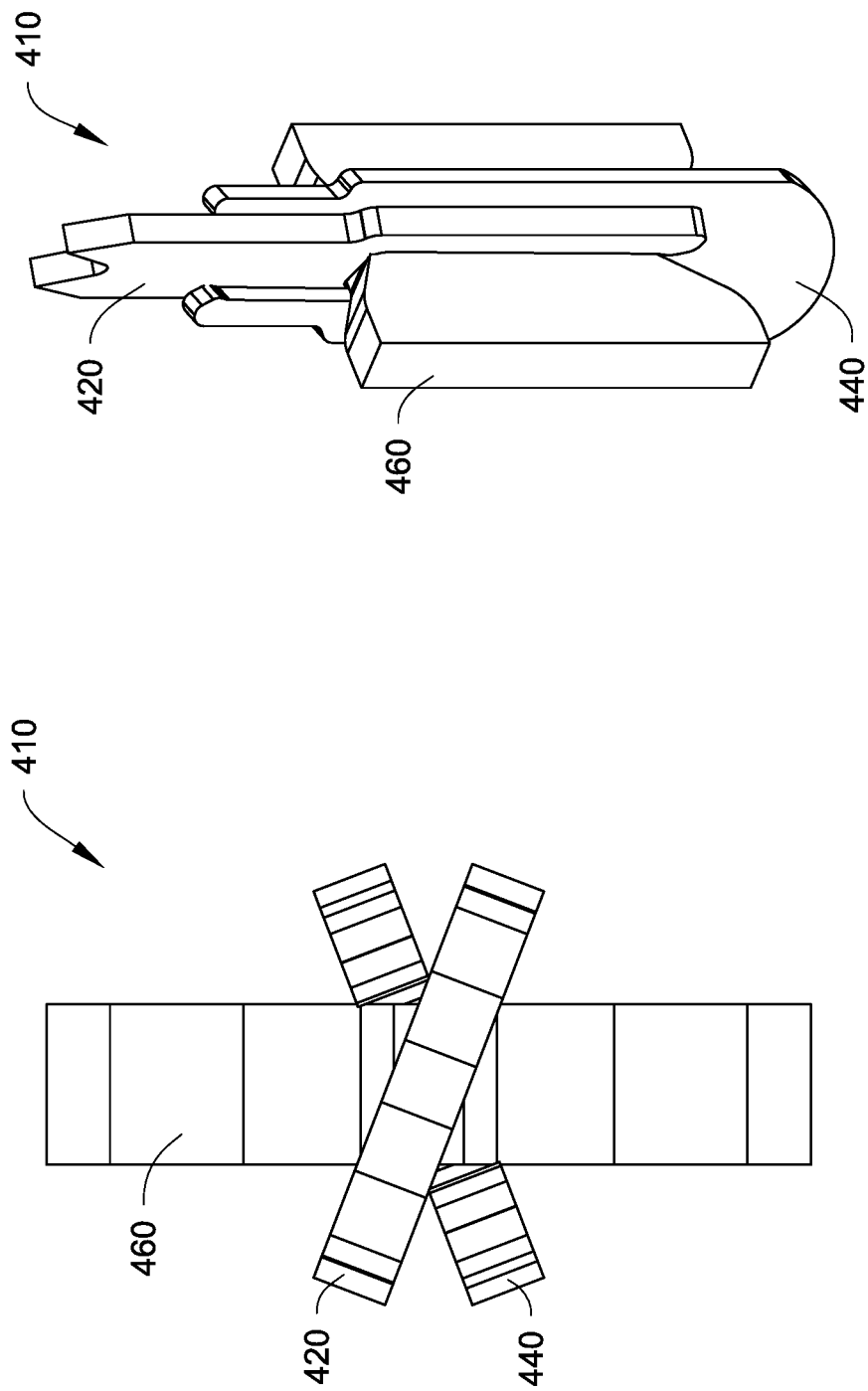
FIG. 17J is a perspective view of the contact assembly of FIG. 17A being assembled and in a partially compressed state, according to an embodiment.

FIG. 17B is a perspective view of the contact assembly 410 of FIG. 17A being assembled and in an uncompressed state. FIG. 17C is a side view of FIG. 17B viewed in the width (X) direction. FIG. 17D is a side view of FIG. 17B viewed in the thickness (Y) direction. FIG. 17E is a top view of FIG. 17B. FIG. 17F is a perspective view of the contact assembly 410 of FIG. 17A being assembled and in a compressed state. FIG. 17G is a side view of FIG. 17F viewed in the thickness (Y) direction. FIG. 17H is a side view of FIG. 17F viewed in the width (X) direction. FIG. 17I is a top view of FIG. 17F. FIG. 17J is a perspective view of the contact assembly 410 of FIG. 17A being assembled and in a partially compressed state.

When being assembled, the blades 420 and 440 are in a "cross" configuration forming a substantially X-shape in a top view (see e.g., FIGS. 17E and 17I) where corresponding guide arms (436, 456) of the blade pairs make partial contact with each other as they slide by. As shown in FIGS. 17A-17J, when being assembled, the elastomer 460 is being accommodated within the aperture 452 of the load board contact blade 440, and a thickness direction of the elastomer 460 (which is aligned with the Y direction in FIG. 17E) and a width direction of the load board contact blade 440 form an angle θ (which is less than 90 degrees, and preferably 45-75 degrees). That is, the thickness direction of the elastomer 460 is not perpendicular to the width direction of the load board contact blade 440. The elastomer 460 is being accommodated partially in the aperture 432 of the DUT contact blade 420, and the thickness direction of the elastomer 460 (which is aligned with the Y direction in FIG. 17E) and a width direction of the DUT contact blade 420 form an angle θ (which is less than 90 degrees). That is, the thickness direction of the elastomer 460 is not perpendicular to the width direction of the DUT contact blade 420. The cross configuration of the blades 420 and 440 can be defined or referred to as the width directions of the blades 420 and 440 forming a substantially X-shape in a top view (see FIG. 17E).

Figure 18A:
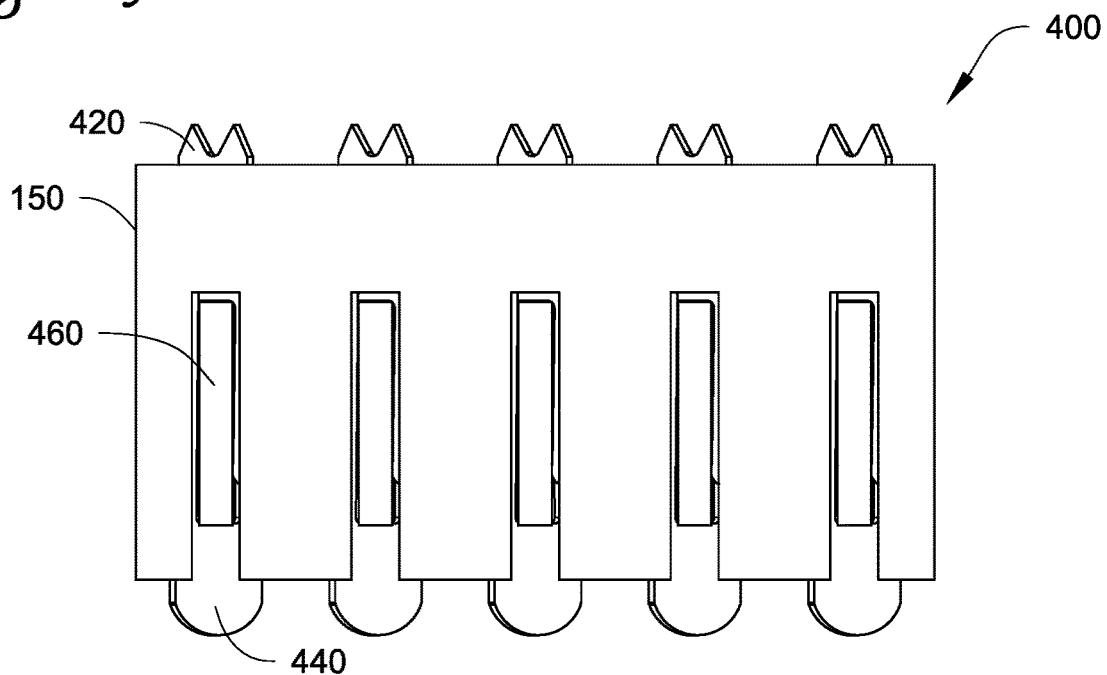
FIGS. 18A-18E are perspective views of a contact assembly array in a housing, according to an embodiment.
Figure 18B:
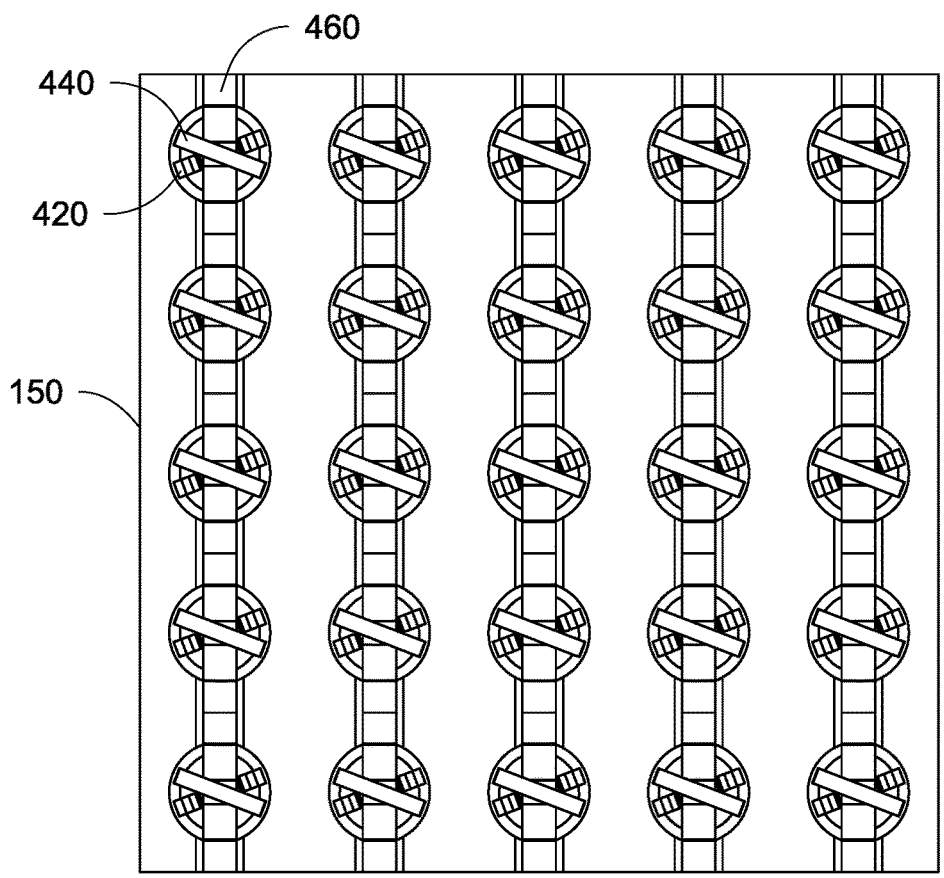
Figure 18C:
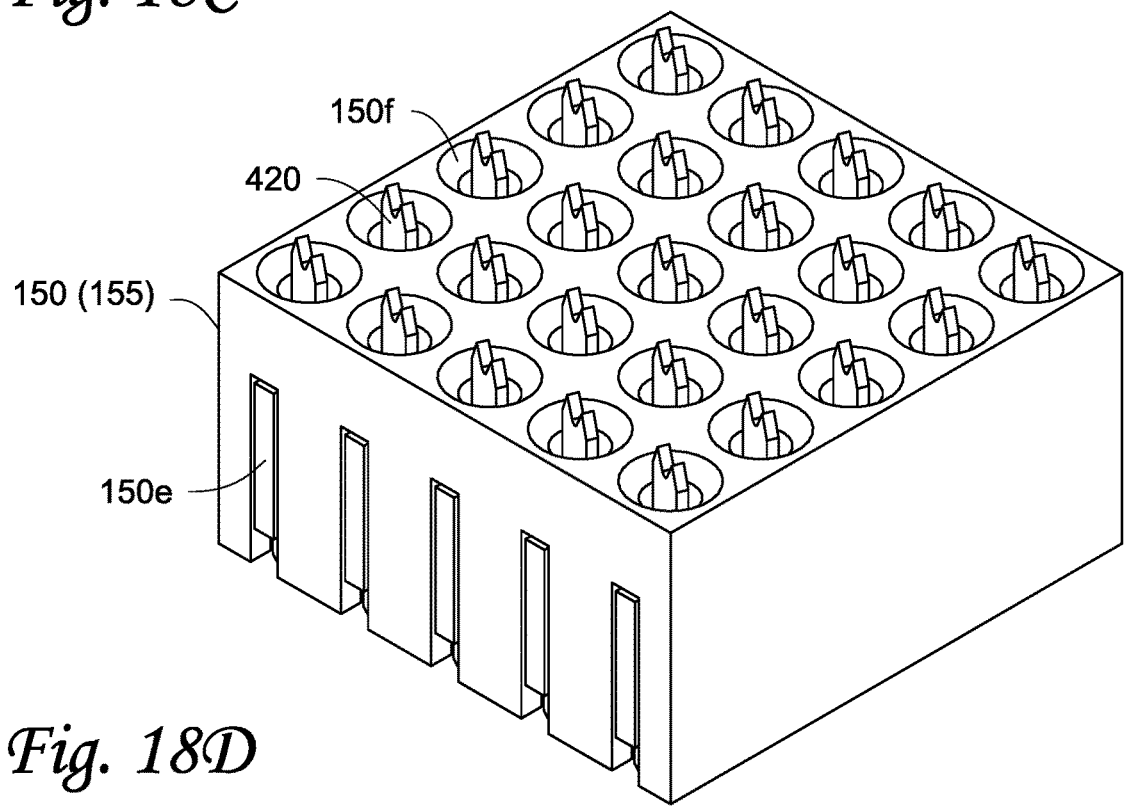
Figure 18D:
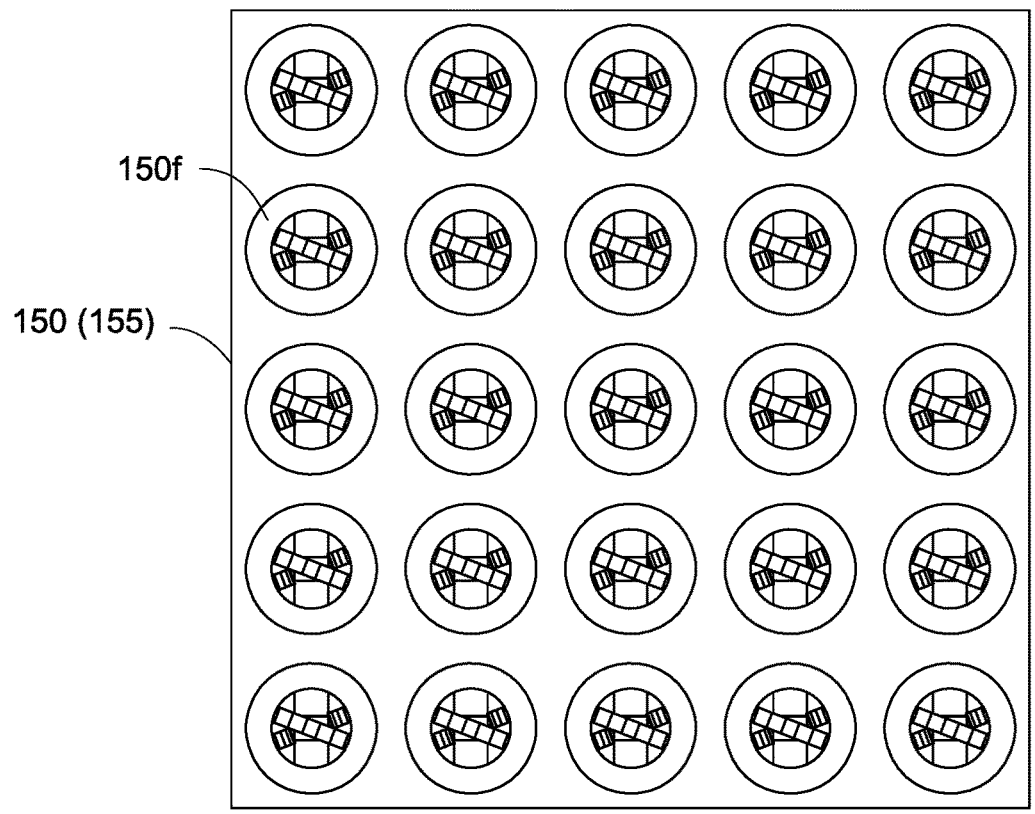
Figure 18E:
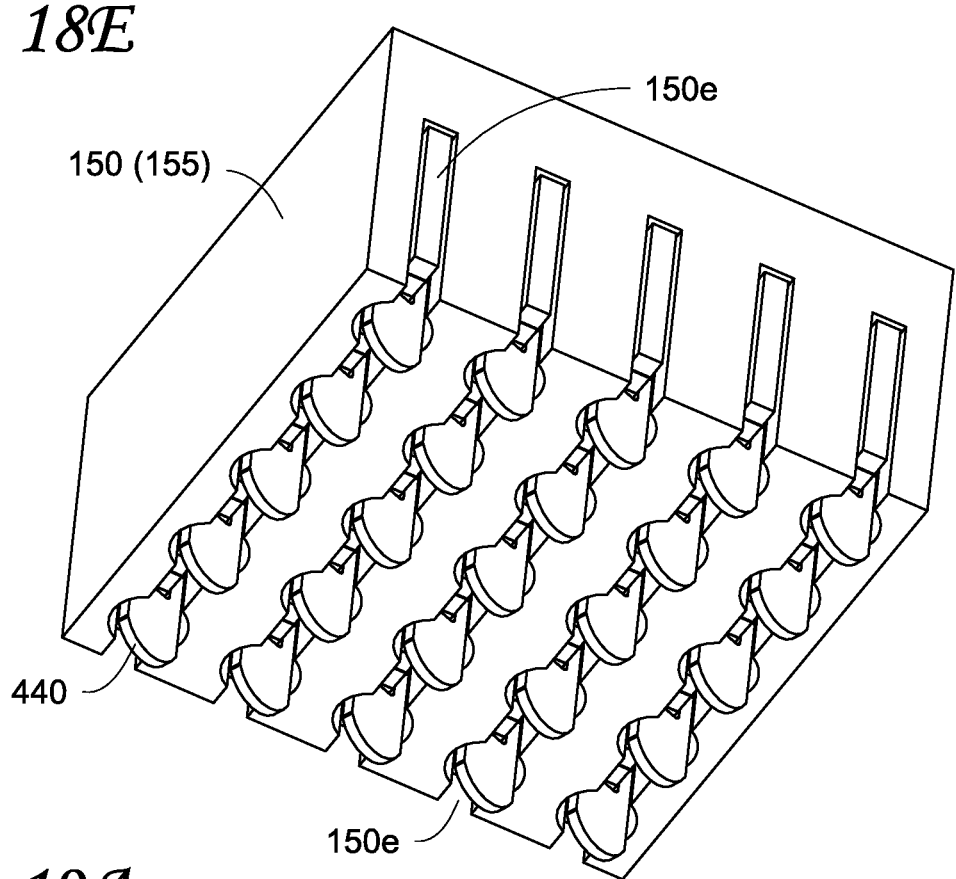

FIGS. 18A-18E are perspective views of a contact assembly array 400 in a housing 155 of a socket 150, according to an embodiment. FIG. 18A is a side view, FIG. 18B is a bottom view, FIG. 18C is a top perspective view, FIG. 18D is a top view, and FIG. 18E is a bottom perspective view. It will be appreciated that the contact assembly array 400 can be the same as or similar to the contact assembly array 300 described herein. As shown in FIG. 18B, a column (or a row) of the contact assembly array 400 can share a same elastomer strip 460, which is accommodated within the elastomer slot 150e of the housing 155. In an embodiment, the elastomer slot 150e can have an opening at each end of the housing 155 to facilitate the assembling. It will also be appreciated that the contact assembly array 400 can be installed into the housing 155 of the socket 150 from the bottom of the housing 155. FIGS. 18A-18E show a cutaway of a BGA socket in a 5 by contact configuration. It will be appreciated that the size of the socket (and the size of the contact assembly array) can be any suitable size.

Figure 19A:
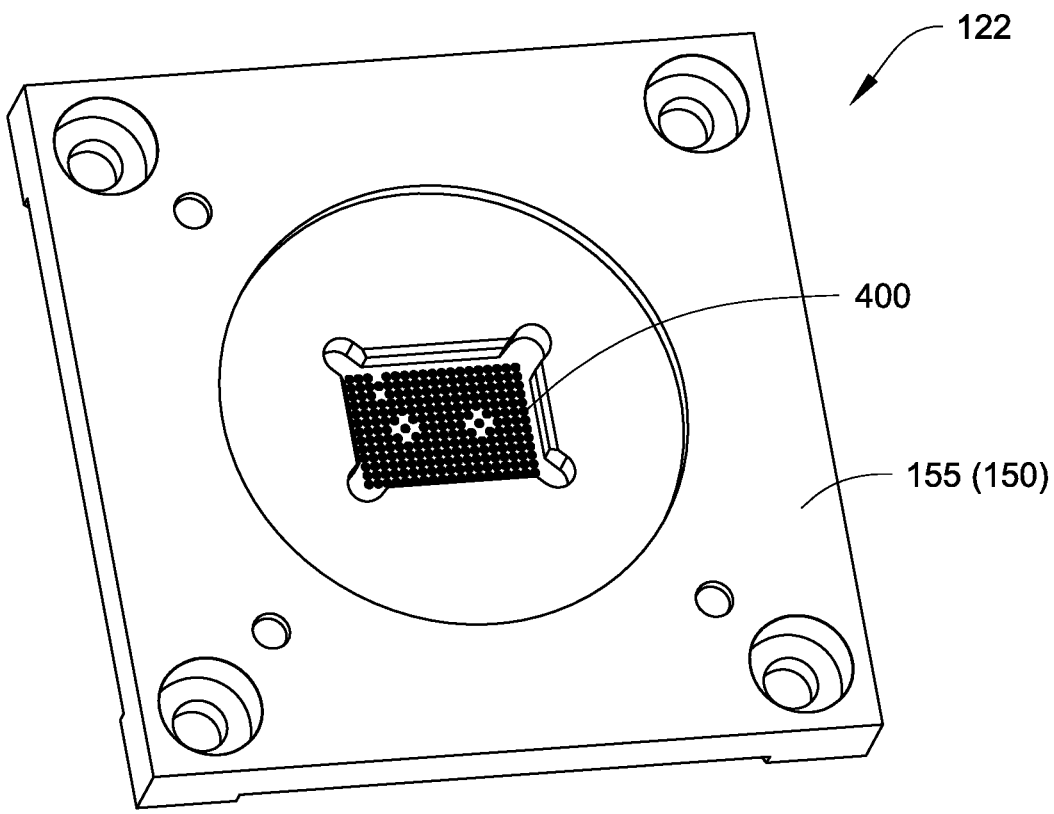
FIGS. 19A and 19B are perspective views of a contact assembly array in a socket, according to an embodiment.
Figure 19B:
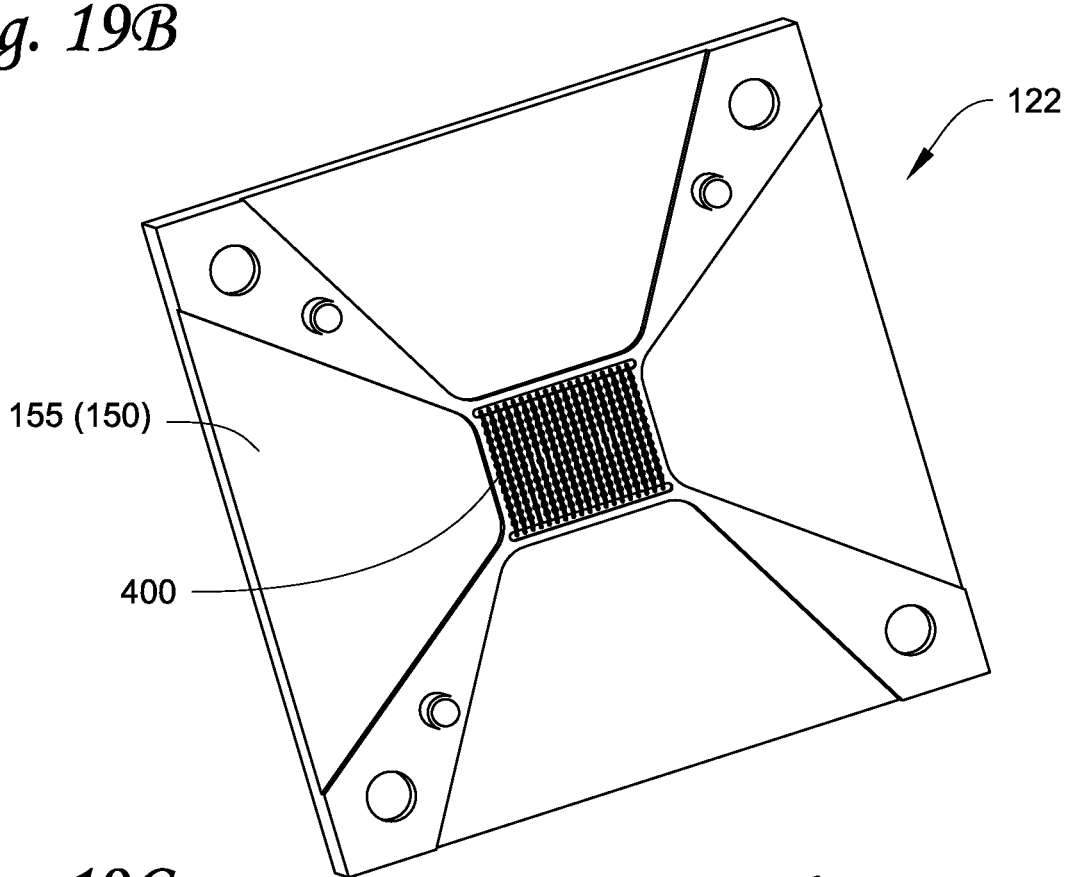
Figure 19C:
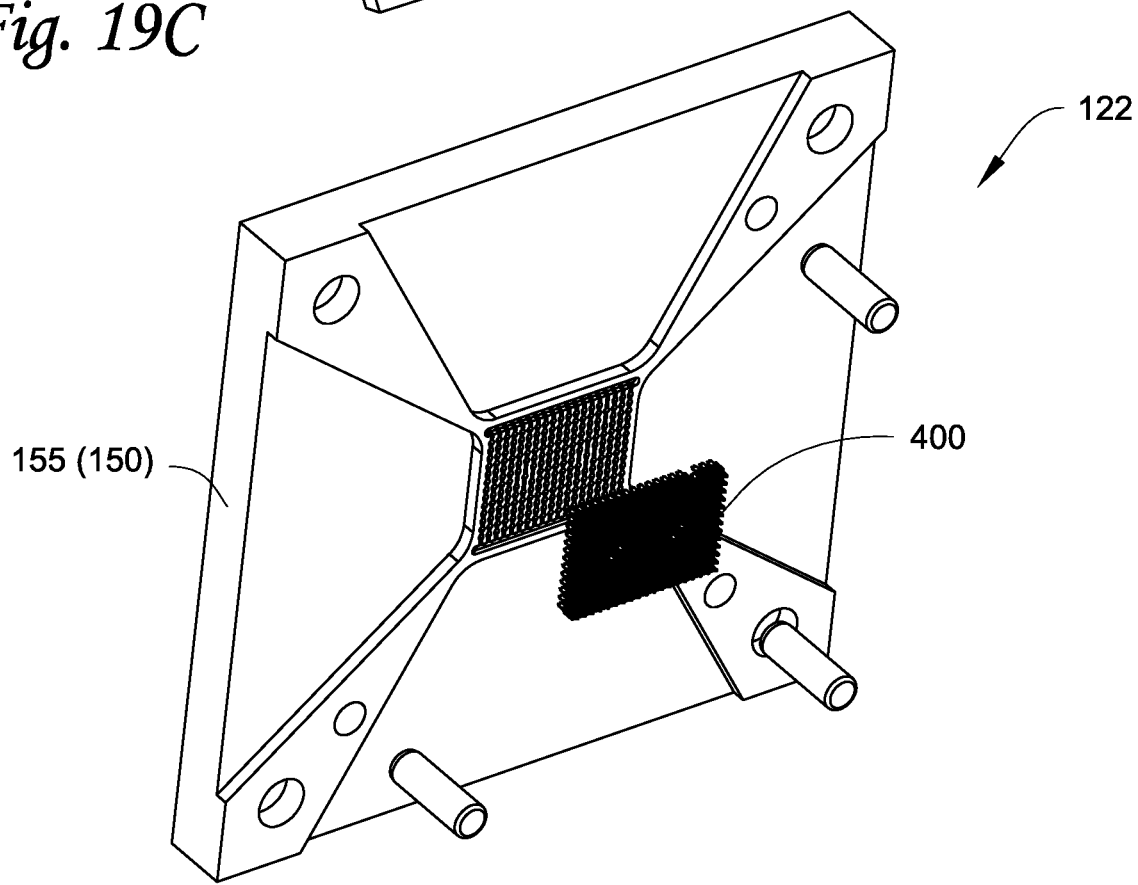
FIG. 19C is an exploded perspective view of a contact assembly array and a socket, according to an embodiment.

FIGS. 19A and 19B are perspective views of a contact assembly array 400 in a socket 150, according to an embodiment. FIG. 19A is a top perspective view and FIG. 19B is a bottom perspective view. FIG. 19C is an exploded perspective view of the contact assembly array 400 and the socket 150, according to an embodiment.

It will be appreciated that the cross configuration disclosed herein can provide better component-component electrical contact, with the elastomer strip 460 providing additional bias force resulting in more stable contact resistance. The elastomer not only biases the pins/blades against the load board and DUT, but also biases the pins/blades against each other to improve electrical contact. Such embodiment can provide a level of part biasing that greatly enhances contact resistance performance. It will also be appreciated that there can be four times force (see dotted arrows in FIG. 17E) acting to twist tines of the blades 420 and 440 to engage and make good wiping contact (e.g., between the blades 420 and 440).

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

Aspects

It is noted that any one of aspects below can be combined with each other.

Aspect 1. A contact assembly for a testing system for testing integrated circuit devices, comprising:
 a pair of first blades and a second blade in a side by side generally parallel relationship, the first blades and the second blade being configured to be longitudinally slidable with respect to each other, the second blade being disposed between the pair of first blades, the first blades and the second blade being staggered in a longitudinal direction; and
 an elastomer configured to retain the first blades and the second blade,
 wherein the first blades and the second blade are electrically conductive;
 each blade of the first blades and the second blade includes a first end and a second end opposite to the first end in the longitudinal direction,
 the first blades and the second blade are arranged so that the first end of each blade is opposite to the first end of an adjacent blade in the longitudinal direction, so that the first end of one blade is adjacent the second end of the adjacent blade,
 the elastomer being at least columnar in part and non-conductive.

Aspect 2. The contact assembly according to aspect 1, wherein the first end of each blade of the first blades includes a pair of tips protruded in the longitudinal direction and a groove disposed between the tips.

Aspect 3. The contact assembly according to aspect 1, wherein the first end of each blade of the first blades includes a curved tip protruded in the longitudinal direction.

Aspect 4. The contact assembly according to any one of aspects 1-3, wherein each blade of the first blades and the second blade includes an aperture,
 the elastomer extends in a thickness direction through the aperture,
 the aperture is disposed below a centerline of each blade in the longitudinal direction.

Aspect 5. The contact assembly according to aspect 4, wherein the aperture has an opening on a side of each blade of the first blades and the second blade.

Aspect 6. The contact assembly according to aspect 5, wherein the opening of each of the first blades is disposed opposite to the opening of the second blade in a transverse direction.

Aspect 7. The contact assembly according to aspect 5, wherein the opening of each of the first blades is facing a same direction as the opening of the second blade.

Aspect 8. The contact assembly according to any one of aspects 4-7, wherein the aperture is enclosed by a body of each blade of the first blades and the second blade.

Aspect 9. The contact assembly according to any one of aspects 4-8, wherein the aperture includes a taper in the longitudinal direction.

Aspect 10. The contact assembly according to any one of aspects 1-9, wherein the elastomer includes castellations at one or more ends of the elastomer in the longitudinal direction.

Aspect 11. The contact assembly according to any one of aspects 1-10, wherein the elastomer includes elastomer segments.

Aspect 12. The contact assembly according to any one of aspects 1-11, further comprising one or more blades in addition to the first blades and the second blade.

Aspect 13. The contact assembly according to any one of aspects 1-12, wherein each blade of the first blades and the second blade includes at least one bump disposed on a side surface of each blade of the first blades and the second blade, the at least one bump extends in a thickness direction.

Aspect 14. A testing system for testing integrated circuit devices, comprising:
 a device under test;
 a load board; and
 a contact assembly including:
  a pair of first blades and a second blade in a side by side generally parallel relationship, the first blades and the second blade being configured to be longitudinally slidable with respect to each other, the second blade being disposed between the pair of first blades, the first blades and the second blade being staggered in a longitudinal direction; and
  an elastomer configured to retain the first blades and the second blade,
  wherein the first blades and the second blade are electrically conductive;
  each blade of the first blades and the second blade includes a first end and a second end opposite to the first end in the longitudinal direction,
  the first blades and the second blade are arranged so that the first end of each blade is opposite to the first end of an adjacent blade in the longitudinal direction, so that the first end of one blade is adjacent the second end of the adjacent blade,
  the elastomer being at least columnar in part and non-conductive,
 wherein the first end of each of the first blades is configured to contact terminals of the device under test,
 the first end of the second blade is configured to contact terminals of the load board.

Aspect 15. The testing system according to aspect 14, wherein the device under test is a ball grid array device.

Aspect 16. The testing system according to aspect 14, wherein the device under test is one of a land grid array device, a quad-flat no-leads device, or a thin small outline package device.

Aspect 17. The testing system according to any one of aspects 14-16, further comprising:
a housing,
wherein the contact assembly is disposed inside the housing,
the elastomer is wedged into the housing to retain the contact assembly in the housing.

Aspect 18. The testing system according to any one of aspects 14-17, further comprising:
a socket;
wherein the socket is configured to provide a pathway from inputs and outputs of the device under test to inputs and outputs of the load board, respectively.

Aspect 19. The testing system according to any one of aspects 14-18, wherein the elastomer includes elastomer segments.

Aspect 20. A method of assembling and positioning a contact assembly in a testing system for testing integrated circuit devices, the method comprising:
arranging a pair of first blades and a second blade of the contact assembly so that a first end of each blade of the first blades and the second blade is opposite to a first end of an adjacent blade in a longitudinal direction, the first end of one blade being adjacent a second end of an adjacent blade, the second end being opposite to the first end in the longitudinal direction, the second blade being disposed between the pair of first blades, the first blades and the second blade being staggered in the longitudinal direction, and the first blades and the second blade being electrically conductive;
retaining the first blades and the second blade with an elastomer of the contact assembly, the first blades and the second blade being in a side by side generally parallel relationship, the first blades and the second blade being configured to be longitudinally slidable with respect to each other, and the elastomer being at least columnar in part and non-conductive; and
installing the contact assembly in a housing.

Aspect 21. A contact assembly for a testing system for testing integrated circuit devices, comprising:
at least one grouping of blades including a first blade, a second blade and a third blade; the first blade, the second blade, and the third blade being in a side by side generally parallel relationship; the first blade, the second blade, and the third blade being configured to be longitudinally slidable with respect to each other; the second blade being disposed between the first blade and the third blade; the first blade and the second blade being staggered in a longitudinal direction; and
an elastomer having two faces, being configured to be retained by the first, second, and third blades;
wherein each of the blades includes an elongated longitudinal elastomer aperture sized to receive one face and a portion of the elastomer, and wherein together both faces of the elastomer are in contact with blade recesses thereby substantially retaining and surrounding a portion of the elastomer;
wherein the blades are electrically conductive;
the first and second blades including a first end and a second end opposite to the first end in the longitudinal direction,
the first blade and the second blade are arranged so that the first end of each blade is opposite to the first end of an adjacent blade in the longitudinal direction, so that the first end of one blade is adjacent the second end of the adjacent blade; and
the elastomer is at least columnar in part and non-conductive.

Aspect 22. A method of retaining contact pins connecting contacts of a device under test (DUT) to a load board, the pins including at least first, second, and third blades, comprising:
configuring the blades to have a body and top and bottom ends and a recessed section in the body between said ends, the recessed section being sized to receive an elongated elastomer;
orienting the first and third blades to have a recess open on a first side;
orienting the second blade to have a recess open on a second side, opposite of the first and third blades;
assembling the first, second, and third blades with the first and third blades surrounding the elastomer on the first side and the second blade surrounding the elastomer on the second side, thereby capturing the elastomer.

Aspect 23. A contact assembly for a testing system for testing integrated circuit devices, comprising:
at least one grouping of blades including a first blade, a second blade and a third blade; the first blade, the second blade, and the third blade being disposed in a side by side generally parallel relationship; the first blade, the second blade, and the third blade being configured to be longitudinally slidable with respect to each other; the second blade being disposed between the first blade and the third blade; the first blade and the second blade being staggered in a longitudinal direction; the second blade and the third blade being staggered in the longitudinal direction; the first blade is generally identical to the second blade; and
an elastomer having a first side and a second side, the elastomer being configured to be retained by the first blade, the second blade, and the third blade;
wherein each of the first, second, and third blades includes an elongated longitudinal elastomer aperture having a recessed opening and sized to receive and surround at least a portion of the elastomer;
wherein the opening of the aperture of the second blade is disposed opposite to the openings of the apertures of the first blade and the third blade, so that when the first, second, and third blades are brought to together, the elastomer is fully surrounded;
wherein the first side of the elastomer is in contact with the first blade and the third blade and is disposed at the opening of the aperture of the second blade;
wherein the second side of the elastomer is in contact with the second blade and is disposed at the openings of the apertures of the first blade and the third blade;
wherein the apertures of the first, the second, and the third blades substantially retain and surround a portion of the elastomer;
wherein the blades are electrically conductive; and the elastomer is at least columnar in part and non-conductive.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. A contact assembly for a testing system for testing integrated circuit devices, comprising:
    a first blade;
    a second blade; and
    an elastomer configured to retain the first blade and the second blade,
    wherein the first blade and the second blade are electrically conductive,
    the first blade and the second blade are arranged in a cross configuration so that the first blade and the second blade form a substantially X-shape in a top view when assembled,
    the elastomer is at least columnar in part and non-conductive, and
    the elastomer is configured to provide a rotational bias force to twist arms of the first blade and the second blade on the X-shape formed by the first blade and the second blade.

2. The contact assembly according to claim 1, wherein a first end of the first blade includes a pair of tips protruded in a longitudinal direction and a groove disposed between the tips.

3. The contact assembly according to claim 1, wherein the first blade includes a pair of spaced apart guide arms which define an aperture, the second blade includes a pair of spaced apart guide arms which define an aperture, the elastomer extends through the aperture of the first blade and the aperture of the second blade.

4. The contact assembly according to claim 3, wherein the aperture of the first blade has an opening on a second end of the first blade, and the aperture of the second blade has an opening on an end of the second blade.

5. The contact assembly according to claim 4, wherein the opening of the first blade is disposed opposite to the opening of the second blade in a longitudinal direction, each of the aperture of the first blade and the aperture of the second blade includes a recess having a bottom floor, the bottom floor is angled to urge the guide arms of the first blade and the guide arms of the second blade into contact with each other in response to an elastomer bias.

6. The contact assembly according to claim 1, wherein the first blade includes a shoulder at each side of the first blade, each shoulder of the first blade extends outwards in a width direction of the first blade.

7. The contact assembly according to claim 1, wherein the second blade includes a shoulder at each side of the second blade, each shoulder of the second blade extends outwards in a width direction of the second blade, and the second blade includes a curved end.

8. The contact assembly according to claim 1, wherein the first blade includes a pair of spaced apart guide arms, the second blade includes a pair of spaced apart guide arms, and
    wherein when assembled, the elastomer is configured to provide the rotational bias force to engage the guide arms of the first blade and the guide arms of the second blade such that the guide arms of the first blade and the guide arms of the second blade make wiping contact.

9. The contact assembly according to claim 1, wherein in the top view, the elastomer extends in a direction passing through an intersection of the X-shape, the elastomer and the first blade form a first angle, the elastomer and the second blade form a second angle, the first angle and the second angle being less than 90 degrees.

10. The contact assembly according to claim 9, wherein the first angle and the second angle are between 45 degrees and 75 degrees.

11. A testing system for testing integrated circuit devices, comprising:
    a device under test;
    a load board; and
    a contact assembly including:
        a first blade;
        a second blade; and
        an elastomer configured to retain the first blade and the second blade,
        wherein the first blade and the second blade are electrically conductive,
        the first blade and the second blade are arranged in a cross configuration so that the first blade and the second blade form a substantially X-shape in a top view when assembled, and
        the elastomer is at least columnar in part and non-conductive,
    wherein a first end of the first blade is configured to contact a terminal of the device under test,
    a first end of the second blade is configured to contact a terminal of the load board,
    the elastomer is configured to provide a rotational bias force to twist arms of the first blade and the second blade on the X-shape formed by the first blade and the second blade.

12. The testing system according to claim 11, wherein the device under test is a ball grid array device.

13. The testing system according to claim 11, wherein the device under test is one of a land grid array device, a quad-flat no-leads device, or a thin small outline package device.

14. The testing system according to claim 11, further comprising:
    a housing,
    wherein the contact assembly is disposed inside the housing,
    the elastomer is wedged into the housing to retain the contact assembly in the housing.

15. The testing system according to claim 11, further comprising:
    a socket,
    wherein the socket is configured to provide a pathway from inputs and outputs of the device under test to inputs and outputs of the load board, respectively.

16. A method of assembling and positioning a contact assembly in a testing system for testing integrated circuit devices, the method comprising:
    arranging a first blade and a second blade of the contact assembly in a cross configuration so that the first blade and the second blade form a substantially X-shape in a top view, the first blade and the second blade being electrically conductive;

retaining the first blade and the second blade with an elastomer of the contact assembly, the elastomer being at least columnar in part and non-conductive; and installing the contact assembly in a housing, wherein the elastomer is configured to provide a rotational bias force to twist arms of the first blade and the second blade on the X-shape formed by the first blade and the second blade.

17. The method according to claim 16, wherein the first blade includes a pair of spaced apart guide arms which define an aperture, the second blade includes a pair of spaced apart guide arms which define an aperture, the elastomer extends through the aperture of the first blade and the aperture of the second blade.

18. The method according to claim 17, wherein the aperture of the first blade has an opening on a second end of the first blade, and the aperture of the second blade has an opening on an end of the second blade.

19. The method according to claim 18, wherein the opening of the first blade is disposed opposite to the opening of the second blade in a longitudinal direction, each of the aperture of the first blade and the aperture of the second blade includes a recess having a bottom floor, the bottom floor is angled to urge the guide arms of the first blade and the guide arms of the second blade into contact with each other in response to an elastomer bias.

20. The method according to claim 16, wherein the first blade includes a shoulder at each side of the first blade, each shoulder of the first blade extends outwards in a width direction of the first blade, wherein the second blade includes a shoulder at each side of the second blade, each shoulder of the second blade extends outwards in a width direction of the second blade, and the second blade includes a curved end.

\* \* \* \* \*